(12) United States Patent
Jain

(10) Patent No.: US 10,505,062 B2
(45) Date of Patent: Dec. 10, 2019

(54) HIGH EFFICIENCY TANDEM SOLAR CELLS AND A METHOD FOR FABRICATING SAME

(76) Inventor: Faquir Chand Jain, Storrs, CT (US)

( * ) Notice: Subject to any disclaimer, the term of this patent is extended or adjusted under 35 U.S.C. 154(b) by 598 days.

(21) Appl. No.: 12/803,946

(22) Filed: Jul. 9, 2010

(65) Prior Publication Data
US 2011/0005570 A1    Jan. 13, 2011

Related U.S. Application Data

(60) Provisional application No. 61/270,489, filed on Jul. 9, 2009.

(51) Int. Cl.
| | |
|---|---|
| H01L 31/0352 | (2006.01) |
| H01L 31/0725 | (2012.01) |
| B82Y 20/00 | (2011.01) |
| H01L 31/0735 | (2012.01) |
| H01L 31/18 | (2006.01) |

(52) U.S. Cl.
CPC ......... H01L 31/0725 (2013.01); B82Y 20/00 (2013.01); H01L 31/035218 (2013.01); H01L 31/035236 (2013.01); H01L 31/0735 (2013.01); H01L 31/1844 (2013.01); H01L 31/1852 (2013.01); *Y02E 10/544* (2013.01)

(58) Field of Classification Search
None
See application file for complete search history.

(56) References Cited

U.S. PATENT DOCUMENTS

| | | | | |
|---|---|---|---|---|
| 4,633,030 A | * | 12/1986 | Cook | 136/246 |
| 4,688,068 A | * | 8/1987 | Chaffin et al. | 136/249 |
| 7,795,527 B2 | * | 9/2010 | Wada | 136/243 |
| 2002/0117675 A1 | * | 8/2002 | Mascarenhas | 257/87 |
| 2005/0155641 A1 | * | 7/2005 | Fafard | 136/249 |
| 2008/0257405 A1 | * | 10/2008 | Sharps | 136/256 |
| 2011/0048537 A1 | * | 3/2011 | Woodall et al. | 136/262 |

* cited by examiner

*Primary Examiner* — Magali P Slawski
(74) *Attorney, Agent, or Firm* — Steven M McHugh

(57) ABSTRACT

A solar cell structure and a method for fabricating the solar cell structure is provided, where the cell structure includes a plurality of solar cells, wherein each of the solar cells is separated from each adjacent solar cell via at least one of a tunnel junction or a resonant tunneling structure interface, wherein each of the plurality of solar cells is at least partially constructed from a semiconductor material, wherein the semiconductor material has an energy band gap that harnesses photons having energies in a predetermined energy range which is responsive to its energy gap, and wherein each of the plurality of solar cells includes at least one of a p-n junction, an n-p junction, or a Schottky interface, and wherein each of the plurality of solar cells is configured to harness energies in a different solar spectral energy range than the other of the plurality of solar cells.

7 Claims, 34 Drawing Sheets

Schematic cross-section of single-junction quantum dot based solar cell structure realized on a quartz substrate using self-assembled quantum dots in ZnSe matrix Schematic cross-section of two-junction tandem solar cell structure realized on a quartz substrate using self-assembled quantum dots (three dot sizes) with reducing energy gaps harnessing three spectral ranges.

Front illuminated tandem cell comprising of Ge homojunction bottom cell and a top quantum dot cell having at least two sizes of nanodots. The substrate is single crystal germanium.

RTS structure incorporated under the first set of Ge quantum dots. Silicon-on-sapphire substrate with Ge quantum dots in ZnSe based matrix.

**Ge QDs in n-ZnSe matrix (self-assembled, desorbed GeOx, deposited with ZnSe)

Back-illuminated Si quantum dots in ZnS matrix in a single cell configuration on Si-on-sapphire substrate Schematic cross-section of a front illuminated cell having quantum dot on Si substrates

| | |
|---|---|
| T4 | $\varepsilon_r \sim 3.9$ SiO2 [227] |
| T3 | $\varepsilon_r \sim 6$ SiON [228] |
| T2 | $\varepsilon_r \sim 8\text{-}9$ SiOx-Si dots [225] |
| T1 | $\varepsilon_r \sim 10\text{-}12$ GeOx-Ge dots [224] |
| | Semiconductor [223] | a structure where uniform layers can be grown with variable index of refraction which is realized by the assembly of GeOx-cladded Ge nanodots and SiOx-cladded Ge nanodots

Figure 14c

Schematic cross-section of Si substrate with dislocation minimized device layers using low temperature processing following Si FET fabrication

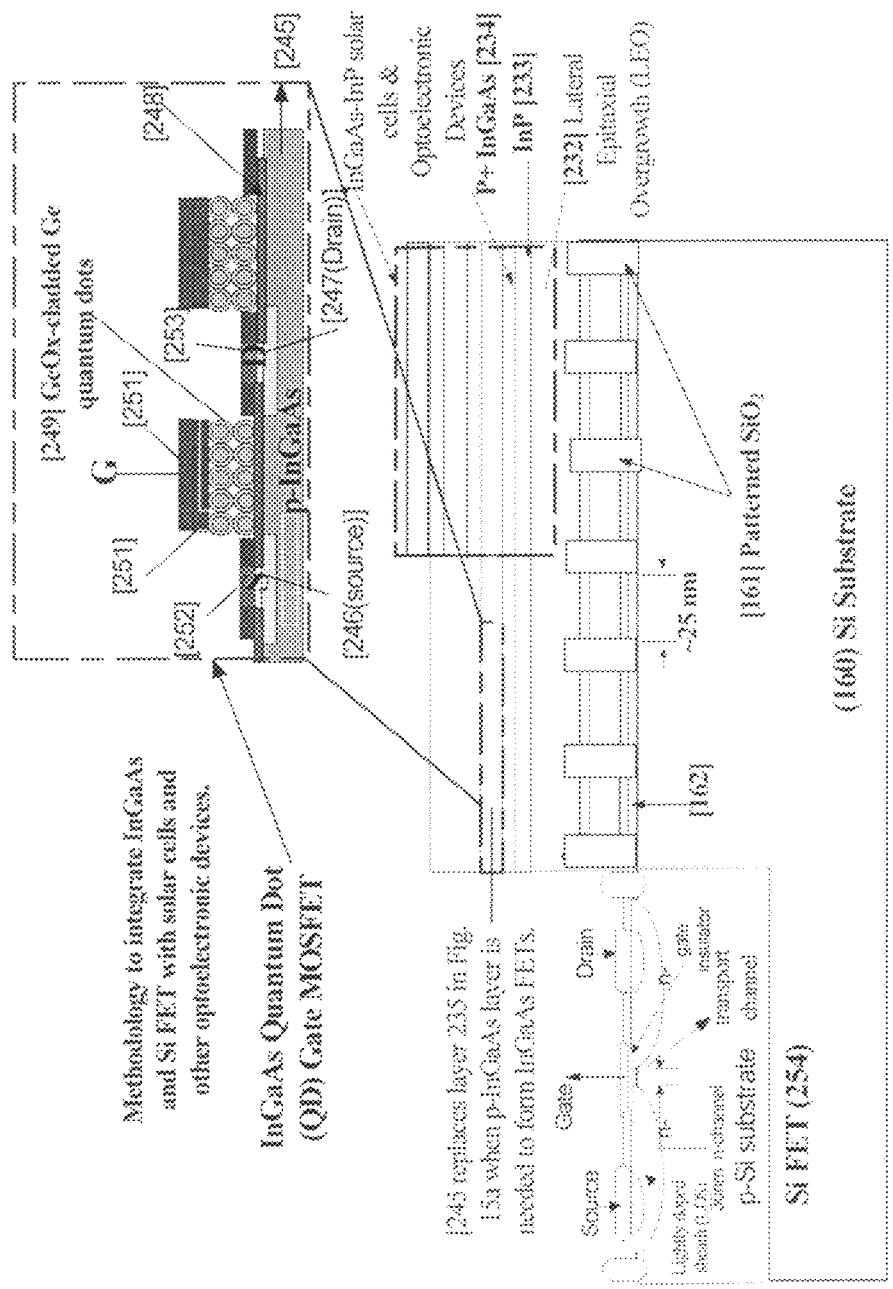
Figure 15b shows integrated InGaAs-FETs (with quantum dot gates) on Si substrate integrating dislocation reduction techniques Tandem cells using Si (bottom cell, homojunction), RTS structure, N-GaP-p(GaAsP-GaP) multiple quantum well heterojunction cell.

homojunction and heterojunction cells integrated with RTS and tunnel junction interfaces block diagram of a structure where a RTS is incorporated at the heterojunction (nGaAs-pGe).

HIGH EFFICIENCY TANDEM SOLAR CELLS AND A METHOD FOR FABRICATING SAME

CROSS REFERENCE TO RELATED APPLICATIONS

This application claims priority to U.S. Provisional Patent Application No. 61/270,489, filed Jul. 9, 2009, the contents of which is incorporated herein by reference in its entirety

FIELD OF THE INVENTION

This invention relates generally to solar cells and more particularly to tandem solar cells, and a method for fabricating the tandem solar cells, whereby the solar cells efficiently harness solar energy in an energy range that conventional tandem solar cells cannot efficiently harness energy.

BACKGROUND OF THE INVENTION

Tandem solar cells that incorporate semiconductors having various energy bandgaps using one or more p-n homojunctions and/or heterojunctions are generally integrated via p+-n+ tunnel junctions. FIG. 1 illustrates a tandem solar cell structure and shows the integration of two (2) n-p homojunction cells via one (1) p+-n+ GaAs tunnel junction [1]. As shown, the tandem solar cell includes a top cell 12 and a bottom cell 13 separated by a tunnel cell 19, where the bottom cell is made of n-p GaAs and the top cell is realized using n-p GaInP (Eg=1.86 eV). As is known, tandem cells efficiently harness solar energy and reduce excess energy losses by absorbing different energy photons in semiconductor layers having different energy gaps. For example, a two junction cell using a GaAs substrate and operating at ~25.7% efficiency, as shown herein, harnesses photon energies above 1.86 eV in the top cell 102 and photon energies in the range of 1.86 eV-1.42 eV in the bottom cell 104. In some instances, cells [2] having 37.9% efficiency under 10× sunlight concentration have been reported. Moreover, referring to FIG. 2a, some tandem cell structures realized on Ge substrates (see FIG. 2a for materials) can potentially produce efficiencies of up to 63.1% [3,4].

Unfortunately, however, as can be seen from the solar spectrum illustrated in FIG. 2b, these multi junction III-V cells (i.e. cells that are at least partially constructed from Group III-V semiconductor materials) do not efficiently harness photons having energies above 2.2 eV. Generally, the cells described in References 1-5 are GaAs and/or Ge based multi-junction structures that may include GaInP, GaInAs and GaInNAs layers with tunnel junctions. For example, one factor that limits the attainment of a predicted efficiency in triple junction III-V cells is the adverse affect of band offset voltage based losses [5]. Table I immediately below shows the offset voltage in multi junction solar cells [5].

TABLE I

Offset Voltage (based loss) in Multi-junction III-V Solar Cells

| Semiconductor | Band gap (eV) | Offset Volt $[(E_g/e) - V_{oc}]$ |
|---|---|---|
| GaAs | 1.44 eV | 0.387 V |
| $Ga_{0.83}In_{0.17}As$ | 1.118 eV | 0.390 V |
| GaInNAs | 1.07 eV | 0.600 V |

Moreover, using Ge and GaAs substrates is relatively expensive and these materials are not abundant in nature.

As such, a method for growing tandem cells is needed whereby Si substrates (single crystal and/or polycrystalline) and Si-on-glass or Si-on-quartz or Si-on-sapphire are used for the growth of Ge epitaxial layers (with reduced dislocation densities resulting from lattice mismatch), wherein the tandem cells efficiently harness photons having energies above 2.2 eV.

SUMMARY OF THE INVENTION

A solar cell structure is provided and includes a plurality of solar cells, wherein each of the plurality of solar cells is separated from each adjacent solar cell via at least one of a tunnel junction or a resonant tunneling structure interface. When the solar cell structure includes the tunnel junction, the tunnel junction cell includes two highly doped semiconducting material layers having opposite conductivity to each other, wherein one of the highly conducting layers is of the same conductivity type as the top layer of the solar cell structure on which it is deposited, and wherein the other of the two highly conducting layers is of the conductivity as that of the bottom layer of the solar cell structure on which it is deposited. When the solar cell structure includes the resonant tunneling structure, the resonant tunneling structure is located between at least one set of two adjacent solar cells, the resonant tunneling structure including a set of at least two thin quantum barrier layers and a thin quantum well layer, wherein the resonant tunneling structure is configured to facilitate current flow between semiconducting layers belonging to two different solar cells having different energy gaps. Each of the plurality of solar cells is at least partially constructed from a semiconductor material, wherein the semiconductor material has an energy band gap that harnesses photons having energies in a predetermined energy range which is responsive to its energy gap, and wherein each of the plurality of solar cells includes at least one of a p-n junction, an n-p junction, or a Schottky interface, and each of the plurality of solar cells is configured to harness energies in a different solar spectral energy range than the other of the plurality of solar cells.

A method of fabricating high efficiency multiple tandem solar cells on a substrate whose lattice constant differs from the lattice constant of the solar cells is provided and includes patterning of a thin masking layer including at least one of a $SiO_2$, SiON, or $Si_3N_4$ material grown or deposited on the substrate, wherein the substrate includes exposed Si regions. The method includes growing epitaxially thin buffer layers followed by a transition layer which transitions the lattice constant of the substrate on top of the buffer layers and gliding dislocations from the transition layer into the masking layer walls using heat treatment. Additionally, the method includes performing epitaxial growth of at least one base semiconductor, above the transition layers and performing lateral epitaxial overgrowth of the base semiconductor over the thin masking layer and building a lattice-matched tandem solar cell structure on the base semiconductor layer, wherein the tandem cells have a plurality of cells comprised of multiple cells harnessing energy from different spectral ranges, wherein the plurality of cells are separated by at least one of a tunnel junction and a resonant tunneling structure.

A method of fabricating antireflection coatings having a two-dimensional grating on a substrate is provide and includes constructing gratings on the substrate, wherein the gratings are constructed using self-assembled SiOx-cladded Si and GeOx-cladded Ge nanodots, wherein the nanodots include an index of refraction, a cladding and a core thickness, and adjusting the index of refraction of the nanodots by adjusting the thicknesses of the nanodot cladding and nanodot core thickness.

BRIEF DESCRIPTION OF THE FIGURES

FIG. 14c shows a structure where uniform layers can be grown with variable index of refraction which is realized by the assembly of $GeO_x$-cladded Ge nanodots and $SiO_x$-cladded Ge nanodots.

FIG. 15b shows integrated InGaAs-FETs (with quantum dot gates) on Si substrate integrating dislocation reduction techniques.

DETAILED DESCRIPTION

Figure 1:
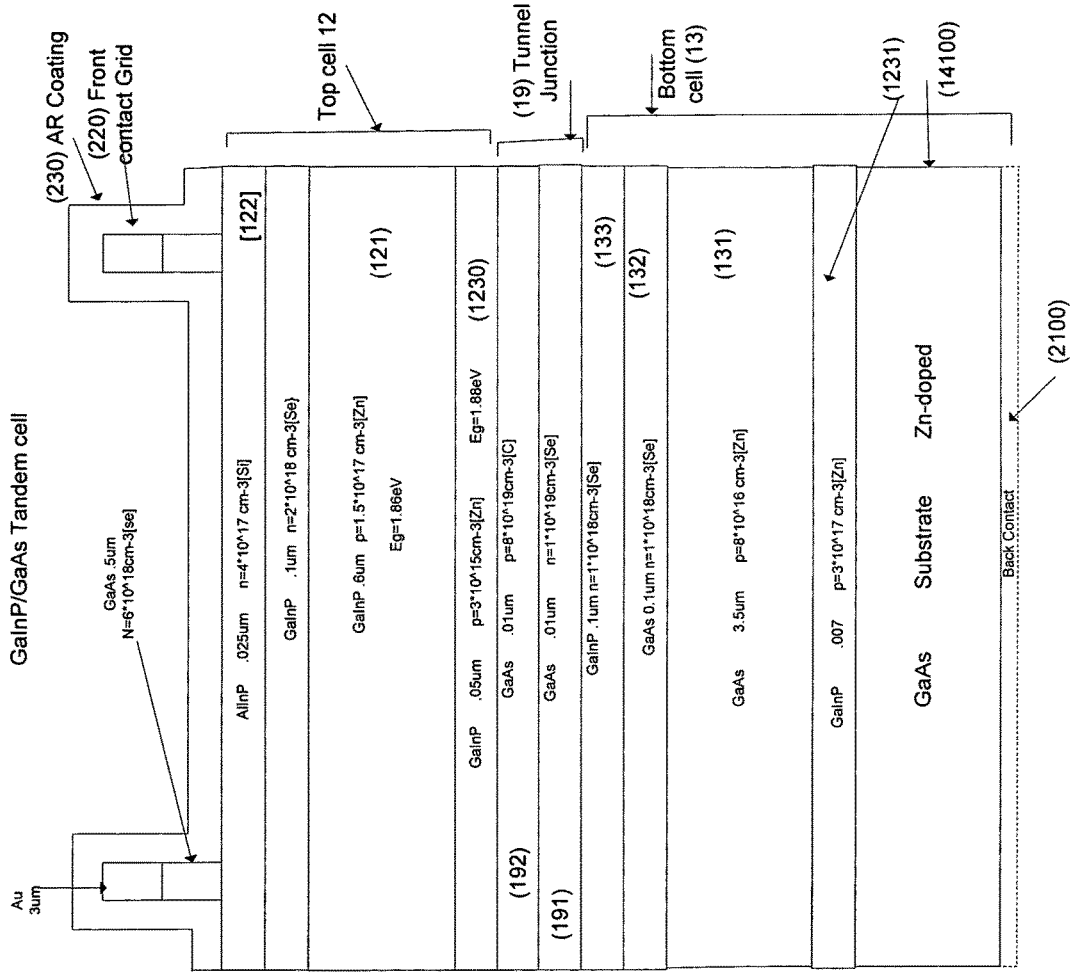
FIG. 1 is a cross-sectional schematic block diagram illustrating one embodiment of a two junction tandem cell on a GaAs substrate incorporating a tunnel junction.

In accordance with the present invention, tandem solar cells and a method for fabricating the tandem solar cells is provided, whereby the solar cells efficiently harness solar energy in an energy range that conventional epitaxial Ge/GaAs/GaInP based tandem solar cells cannot efficiently harness energy. Additionally, a methodology to fabricate high efficiency solar cells on Si substrates using novel dislocation reduction technique is also provided.

In accordance with the invention, a solar cell is provided that incorporates wider energy gap materials to harness solar energy in the 2.2 eV to 3.7 eV range. This is advantageous because conventional epitaxial Ge/GaAs/GaInP based tandem cells do not efficiently convert energies from photons having energies in this range. As is shown and discussed herein below, the integration of multi junction cells that harness excess energy loss in the range of 2.2 eV-3.7 eV solar radiation, using Ge/GaAs compatible II-VI semiconductors such as, for example, ZnSSe, ZnSTe, and ZnMgSSe is described. In one embodiment, the incorporation of a ZnSSe—AlGaInP heterojunction cell is presented where the cell improves conversion efficiencies by harnessing 2.7 eV-2.2 eV photons. In another embodiment, a cell that incorporates multiple II-VI and II-VI/III-V heterojunctions grown over III-V structures is presented, where the cell harnesses 3.5 eV-2.7 eV, 2.7 eV-2.2 eV and 2.2-1.8 eV photons. In yet another embodiment, tandem solar cells which incorporate resonant tunneling structures (RTS), are described. These structures reduce the offset voltage at wide energy gap N/low energy gap n or P-p type hetero-interfaces.

In still yet another embodiment, a method to form tandem cells, using semiconductor layers having different lattice constants, on a Si substrate, with minimized dislocation density resulting in superior efficiency, is described. This method involves growth of low dislocation density epitaxial films using a novel combination of techniques including: (1) nano-patterning of semiconductor layer (on which heteroepitaxial growth is desired) using SiO2 mask, (2) growth of lattice mismatched heteroepitaxial layers in these oxide surrounded nanoislands, (3) patterned hetero-epitaxial processing (PHP) which may include heat treatment of patterned heteroepitaxial regions to glide and bury the dislocations into oxide walls (see references [6 and 7] for PHP without oxide walls and nanoislands), and (4) lateral epitaxial overgrowth techniques [8]. Alternatively, site-specific self-assembly of nano-dots may be used to create nano-islands which are smaller than features obtained by lithographic techniques. Accordingly, tandem III-V and II-VI cells can be grown on Ge layers, which can be grown on more abundant and relatively inexpensive Si substrates.

Also disclosed are tandem solar cells that use at least one layer of self-assembled quantum dots (such as cladded Ge and Si dots) on nano- and micro-crystalline semiconducting films, which may be grown on inexpensive substrates, such as Si, glass, and/or quartz. One embodiment of quantum dot based cells involves using variable sized dots to simulate different energy gaps and to harness selected solar spectrum energies to minimize excess ($h\upsilon - E_g$) energy loss. A novel structure with epitaxial layers grown in narrow boxes (simulating quantum dots of similar sizes) is also disclosed. In this context, a novel method which uses a combination of nano-patterning and patterned heteroepitaxial processing (PHP) is described to achieve dislocation density reduction. Accordingly, dislocation free nanopatternd regions now can serve to nucleate high quality epitaxial layers (e.g. Ge) using lateral epitaxial overgrowth (over oxide or some other material separating the nano-islands].

Figure 3A:
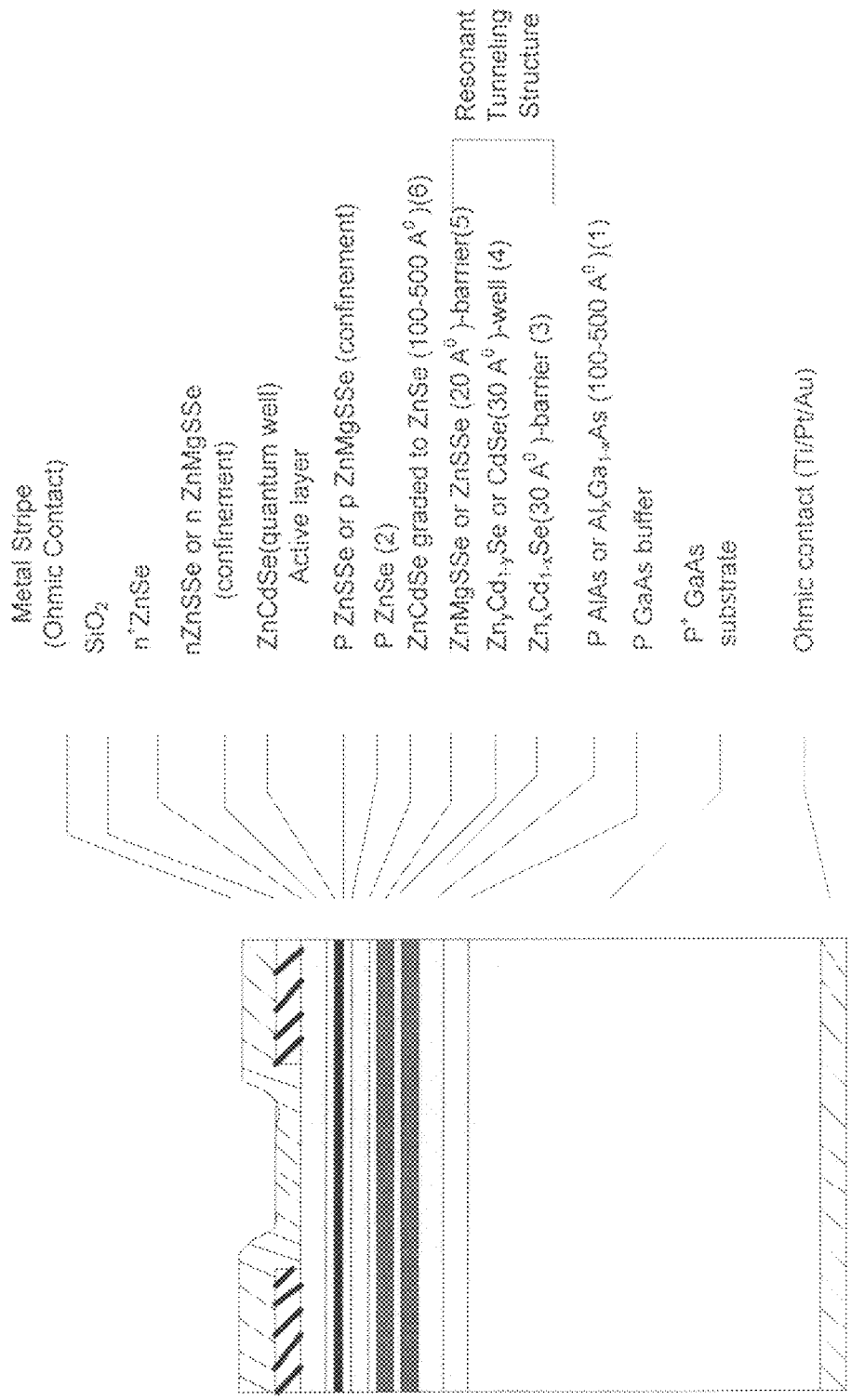
FIG. 3a is a schematic block diagram illustrating one embodiment of a Resonant Tunneling Structure (RTS) used in wide energy gap laser structures.
Figure 3B:
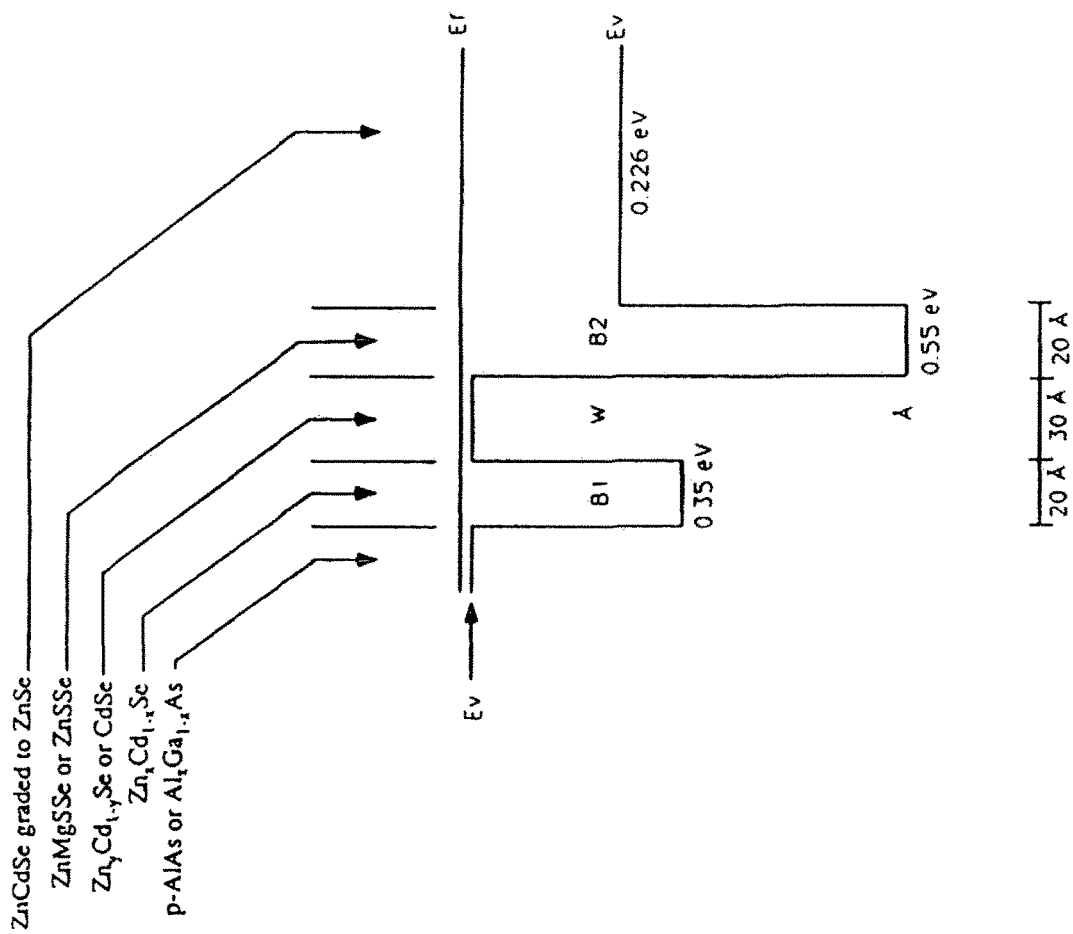
FIG. 3b is an energy band diagram for an RTS structure designed for P-p heterointerfaces.

Accordingly, in light of the above and as disclosed herein, the invention includes,
(1) Integration of cells harnessing above 2.2 eV photons to efficiently incorporate cells that have material that absorbs photons with energies above 2.2 eV, including, but not limited to, II-VI wide energy gap semiconductors in addition to conventional III-V cells along with Ge structures,
(2) Use of resonant tunneling structure (RTS) [9] interfaces to reduce or eliminate the effect of band offset related voltage drops at hetero-interfaces, which result in reduced conversion efficiency.
(3) Use of Resonant Tunneling Structures (RTS) [9] and graded gap [10] techniques have been used in wide energy gap semiconductor lasers, such as ZnMgSSe—ZnCdSe blue green lasers, to form Ohmic contacts. As described herein, RTS structures (asymmetric or symmetric) are used to reduce the voltage drop due to band offsets at hetero-interfaces. FIG. 3a illustrates a typical RTS and FIG. 3b illustrates its current-voltage (I-V) characteristic, respectively. It should be appreciated that RTS structures as disclosed herein having homojunction and/or heterojunction type cells. Additionally, the application of cascaded RTS structures is also disclosed. It should also be appreciated that RTS interfaces along with tunnel junctions, as disclosed herein, provide a methodology to harness conventional as well as quantum dot based cells by configuring them as tandem cells with overall higher conversion efficiency.
(4) Methodology(s) to produce high efficiency cells built on Silicon (single and/or polycrystalline and/or microcrystalline and/or nanocrystalline) substrates using novel dislocation reduction techniques; and
(5) Quantum dot (QD) structures that absorb in different spectral regimes and which can be configured in tandem cell structures.

It should be appreciated that nanowire and quantum dot [11-14], and/or carbon nanotubes and their combination with quantum dots may also be used to fabricate solar cells.

Referring to FIG. 1, a two junction tandem cell on GaAs substrate in accordance with the prior art is shown, where the two junction cell is operating at an efficiency of ~25.7% includes a GaAs cell and an InGaP cell. Here, we have used the layer numbering for Ge (bottom cell) and GaInP (top cell) and tunnel cell or tunnel junction as used in FIG. 4a (which shows the innovation of RTS using this material combination as the example). The top cell is GaInP homojunction cell (12) and the bottom cell is GaAs homojunction cell (13). The constituent layers for the top cell are p–GaInP (121) and n-type GaInP (122), and the homojunction is 27. The constituent layers for the bottom cells are p–GaAs (131) and n–GaAs (132), and the homojunction is 26. The tunnel junction 19 between the two cells is comprised of n+ GaAs (191) and p+ GaAs (192) layers. There is another layer of AlInP (240) on top cell, and the patterned contacting cap layer of GaAs (2200) along with Ohmic contact grid (220) are shown. The antireflection (AR) coating is 230. The substrate is p–GaAs (14100) and the back Ohmic contact is 210. The tunnel junction layer 192 has an additional GaInP layer 1230. Similarly, there is a p-GaInP layer 1231 in the bottom cell. Note that there is no RTS structure in this cell.

Figure 2A:
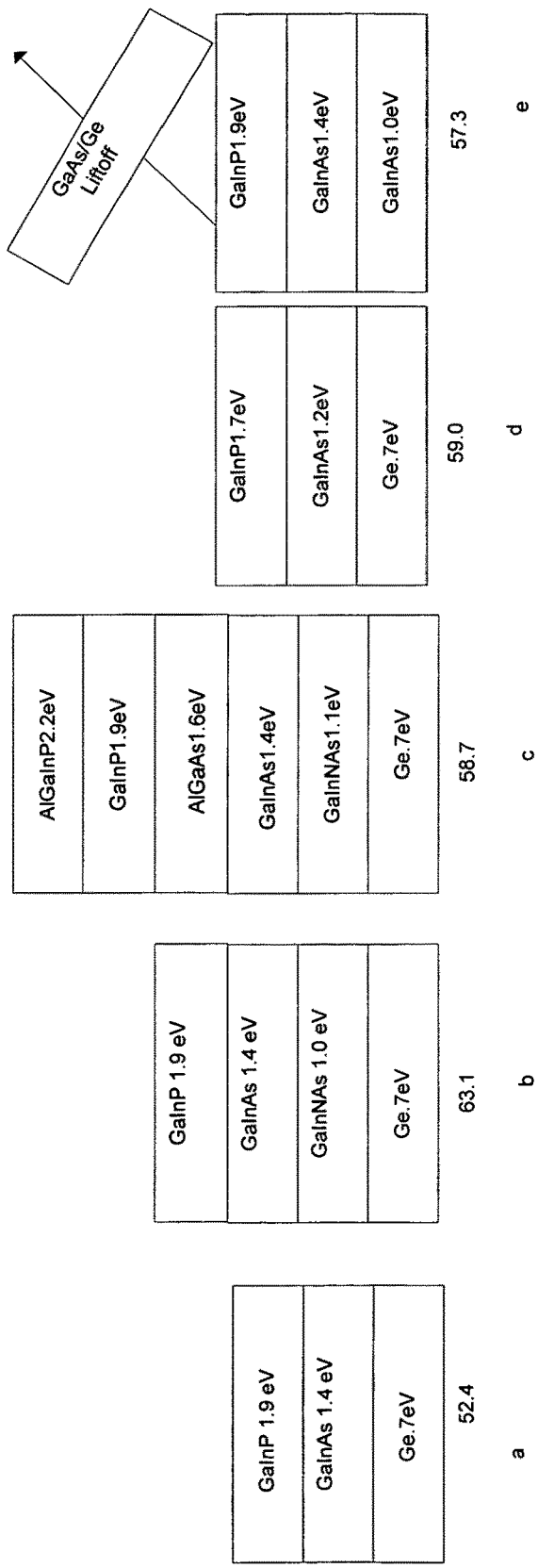
FIG. 2a is a cross-sectional schematic block diagram illustrating materials for multi-junction Ge-compatible solar cells (and their efficiencies).
Figure 2B:
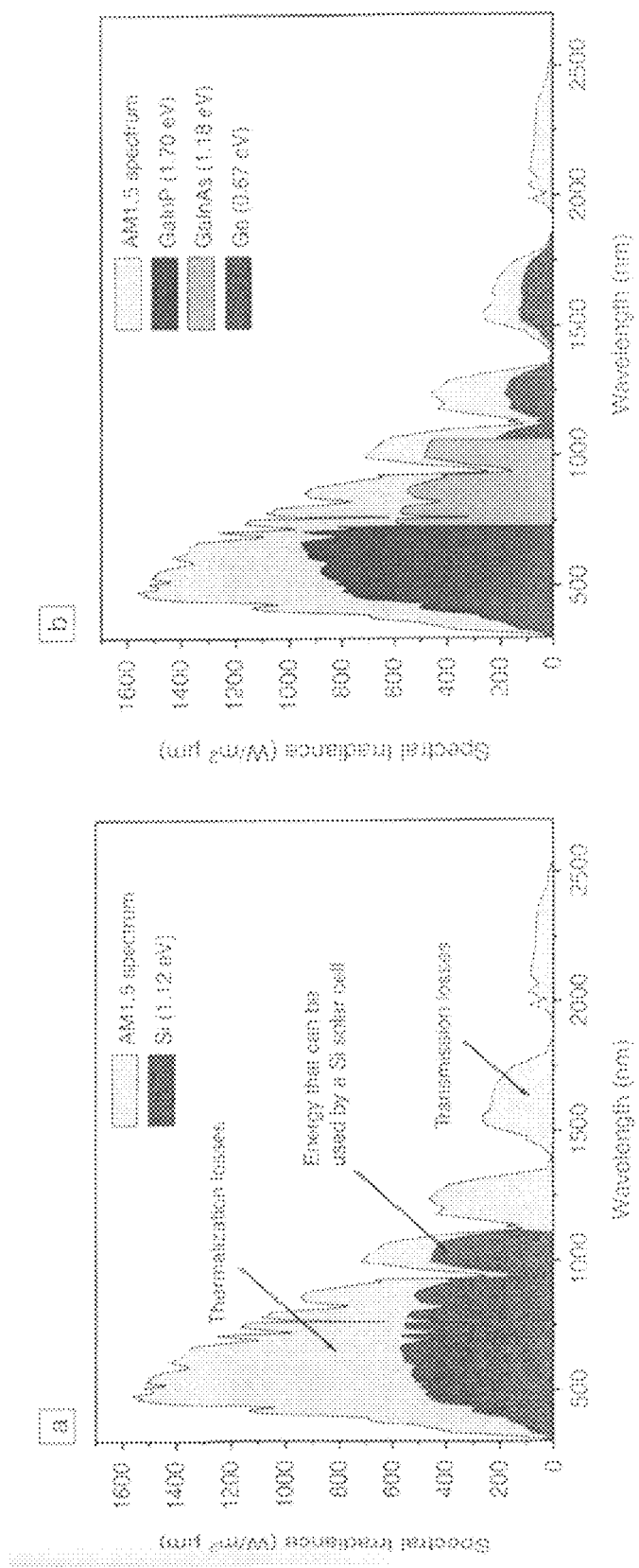
FIG. 2b are graphs illustrating the utilization of photons by Si at AM1 (left) and the utilization of photons by multi junction cells (right).

Referring to FIG. 2a, a partial lists of materials for multi-junction Ge-compatible solar cells (and their efficiencies) are illustrated [3,4]. It should be appreciated that in some cases, tandem cells built on Ge substrates can potentially produce efficiencies up to 63.1% (using layers of GaInP/GaInAs/GaInNAs). It should also be appreciated that tandem cells using metamorphic structure have achieved 40% efficiency. Referring to FIG. 2b, graphs illustrating the utilization of photons by Si (See graph a) and the utilization of photons by multi-junction cells (See graph b) are shown.

Figure 3C:
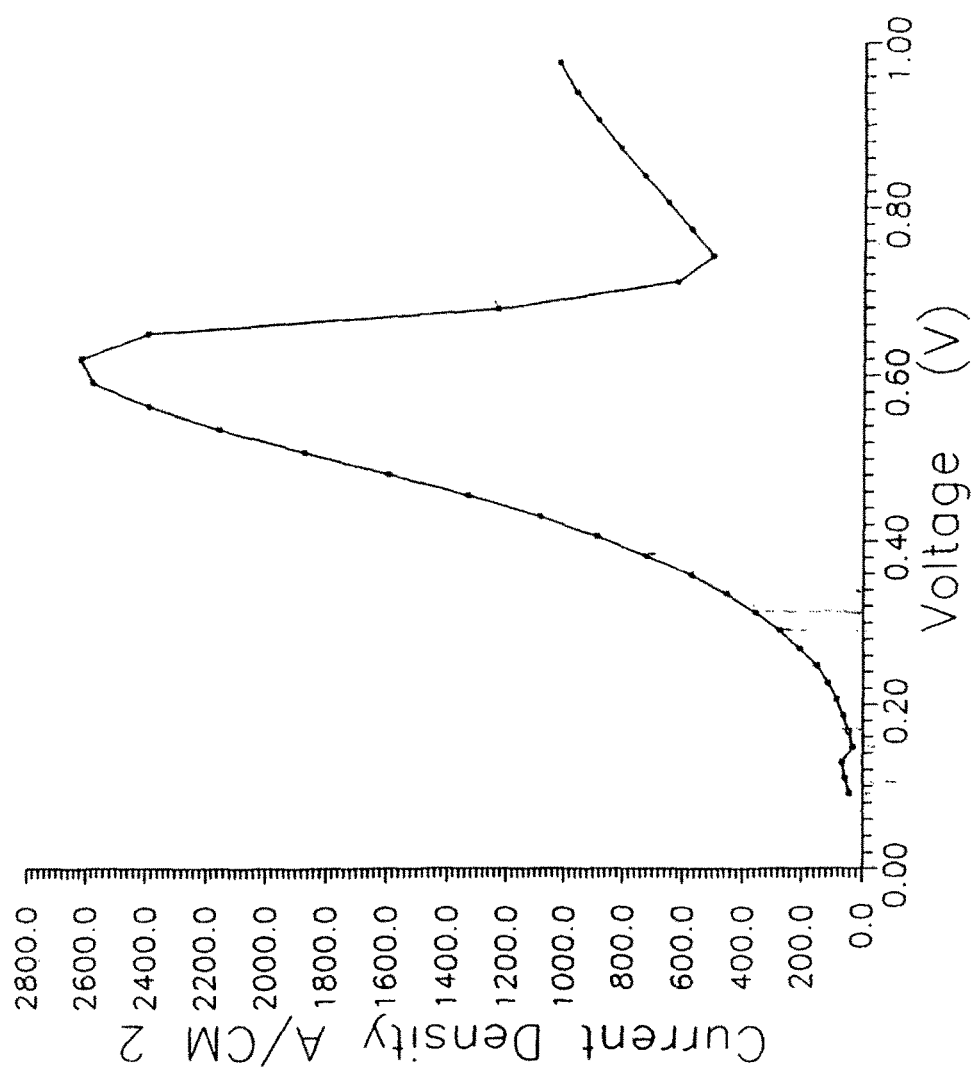
FIG. 3c is a graph illustrating electrical characteristic current-voltage (i-v) of a RTS interface (simulated).

Referring to FIG. 3a, FIG. 3b and FIG. 3c, an asymmetric Resonant Tunneling Structure (RTS) for wide energy gap lasers is illustrated (See FIG. 3a) along with energy band diagram (See FIG. 3b) used in simulating electrical characteristic current-voltage (I-V) of the RTS interface in FIG. 3c). It should be appreciated that graded gap and other structures could be used to form Ohmic contacts. Here, the RTS facilitates offset minimized electrical conduction between p-AlAs/Al$_x$Ga$_{1-x}$As layer (1) and p-ZnSe layer (2). RTS comprises a ZnCdSe barrier layer (3), quantum well layer (4), and another ZnMgSSe or ZnSSe barrier layer (5) with an optional graded layer of ZnCdSe (6). As shown later in FIG. 4e, a second RTS may be used to replace this graded layer. That is, one can use a cascaded (more than one) RTS structures in tandem to provide tunnel paths to carriers. The energy levels in the quantum well between two barriers provide a pathway for carriers from p-AlGaAs layer to tunnel to the p-ZnSe layer without being adversely affected by the band offset ($\Delta E_v$) manifested at the pAlGaAs-pZnSe interface.

Figure 4A:
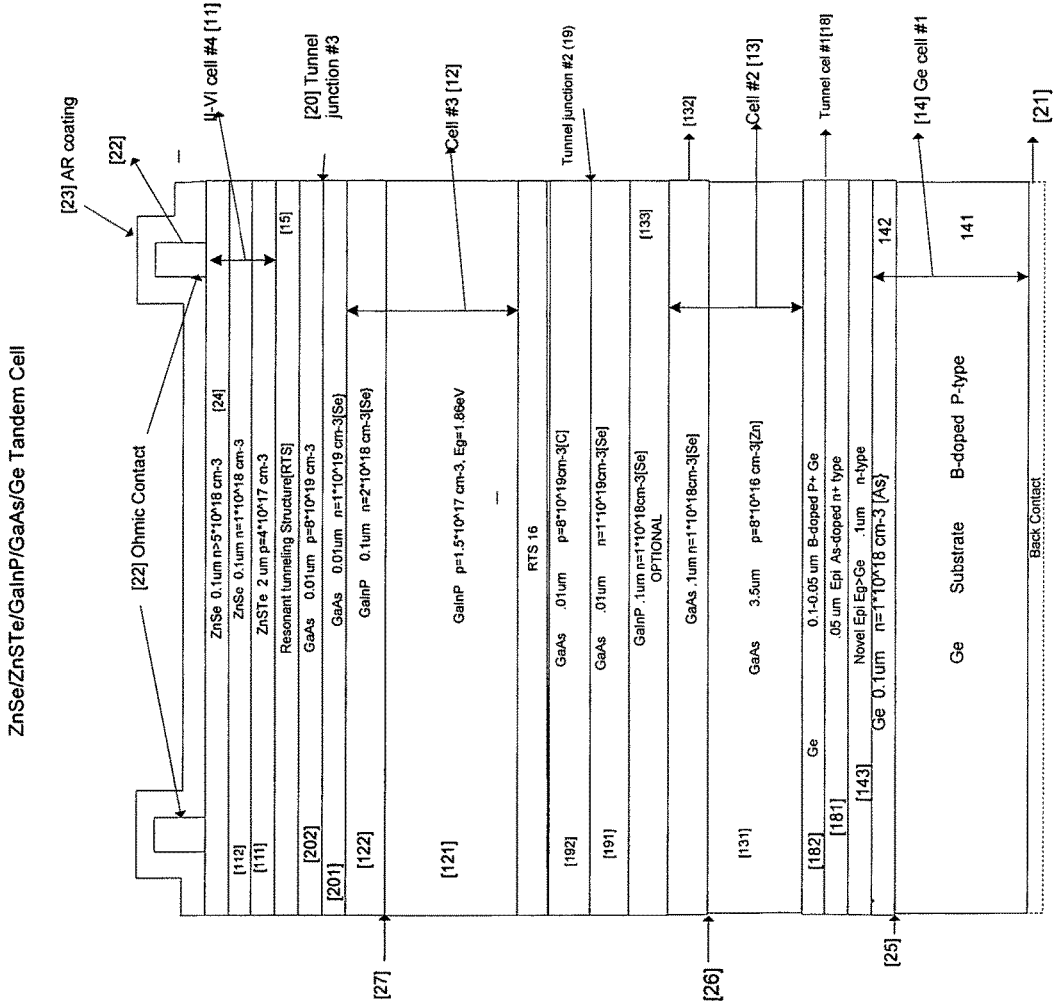
FIG. 4a is a cross-sectional schematic block diagram illustrating one embodiment of a four junction tandem cell structure which incorporates one II-VI (cell #4), two III-V cells (Cells #3 and #2), and one Ge cell (Cell #1). Additionally, in this case two RTS structures are shown schematically without details and an II-VI epitaxial layer is shown over the Ge layer of Cell #1.

FIG. 4a shows a four-junction tandem cell structure, which incorporates a cell (11) (cell #4) constructed from Group II-VI materials (harnessing above 1.88 eV photons), two cells cells #2 (13) and #3 (12)] where each are constructed from Group III-V materials (harnessing 1.86 eV-1.4 eV photons), and a Ge cell# 1 (14) (harnessing 1.42-0.67 eV photons). It is contemplated that a 5-junction cell which optimizes the radiation between 1.88-3.7 eV by using two II-VI solar cells constructed from Group II-VI materials may also be fabricated. The cell #5 may harness photons having energies in the 2.67-3.7 eV range using a ZnSSe—ZnMgSSe cell. It is contemplated that a novel Resonant Tunneling Structure (RTS) 15 may be incorporated, which is designed to reduce the offset voltage between Group III-V material cells and Group II-VI material cells. Additionally, interface between cell #3 (12) [in FIG. 4a which harnesses photons having energies in the range 1.86 eV-1.42 eV] and cell#2 (13) may be optimized by reducing the offset voltage by the introduction of a suitable RTS (16). Similarly, a RTS structure (17) may be introduced between cell 1 (14) and cell 2 (13). FIG. 4a also shows conventional tunnel junctions. Tunnel junction 18 is between cell#1 (14) and cell#2 (13). It consists of an n$^+$Ge layer 181 and a p$^+$ Ge layer 182. Cell 1 is formed on a p-Ge substrate 141 and with an n-Ge layer 142 serving as its thin window region. Cell 2 is formed with p-GaAs [photon absorber] layer 131 and n-GaAs layer 132 [serving as its window region]. Tunnel junction#2 (19) consists of n+ GaAs (191) and p+ GaAs (192) layer is formed between cell#2 (13) and cell#3 (12). Cell#3 (12) is realized using p-GaInP (121) and n-GaInP (122). Similarly, tunnel junction#3 (20) is comprised of an n$^+$ layer 201 and a p$^+$ layer 202, and is formed between cell#3 (12) and cell 4 (11). These layers (201 and 202) are shown to be made of GaAs, but they can be realized in GaInP to avoid band offset issue. Cell 4 (11) consist of a p-type wide energy gap material such as ZnSTe (111) and an n-type layer ZnSe (112). The cell interfaces where band offset is not an issue, a tunnel junction may be employed without an RTS structure. In some cases, wider gap layers such as 143, 133 are incorporated in a homojunctions to improve carrier transport. The bottom most cell #1 (14) has an Ohmic contact 21 and the topmost cell #4 (11) has an appropriate Ohmic contact 22. The Ohmic contact 22 is formed on a highly doped n+ layer 24. The antireflection coating is shown as 23. The novelty here is the incorporation of a resonant tunneling structure (RTS) interface between two cells with and without a tunnel junction between them. For example the RTS 17 is between layer 182 (p$^+$Ge) [lower energy gap] and layer 131 (p-GaAs) [higher energy gap] as FIG. 3b shows between p-AlGaAs [lower energy gap] and p-ZnSe [higher energy gap]. Every RTS needs simulation and experimentation to achieve the current peak at a reduced voltage drop. Examples of RTS are shown later in FIGS. 4d and 4e. RTS comprises at least two quantum barrier and one quantum well layers.

Table II below illustrates a comparison of the conversion efficiencies of cells constructed from Group III-V materials wherein the cells have single, double and triple junctions. In one embodiment, the cell having 3-junctions may include two Group III-V material cells and one Group II-VI material cell (as shown in FIG. 4a, but without the Ge cell). In another embodiment, the 4-junction cell may be identically the same as that shown in FIG. 4. In still yet another embodiment, a 5-junction tandem cell (not shown) may be fabricated to reduce the excess photon energy loss in the visible spectral regime (2.2-2.7 eV), and/or to extend the spectral range to about 3.5 eV. It is contemplated that the 5-junction tandem cell may include Group II-VI material cells that may be divided into multiple (such as, for example two (2)) tandem cells to achieve the above and/or to further reduce the excess photon energy loss in the visible spectral regime (2.2 eV-2.7 eV), and/or to further extend the spectral range to about 3.5 eV.

TABLE II

Comparison of Efficiency for various III-V and Proposed 4-Junction Cell

| Single Junction | *Double | *Triple Junction | | II-VI/III-V/Ge | |
|---|---|---|---|---|---|
| Efficiency | Junction | [Sun Concentration (X)] | | 3 Junction | 4-Junction |
| 25% | 29% | 31% | 1 | 37.8% | 57% |
|  | 31% | 39% | 40 | ~63% | 5-Junction/RTS |

Tale II compares various conventional tandem cells [3]. Here, a five junction cell (shown in FIG. 6b) consisting of novel RTS interfaces are also listed.

Figure 4B:
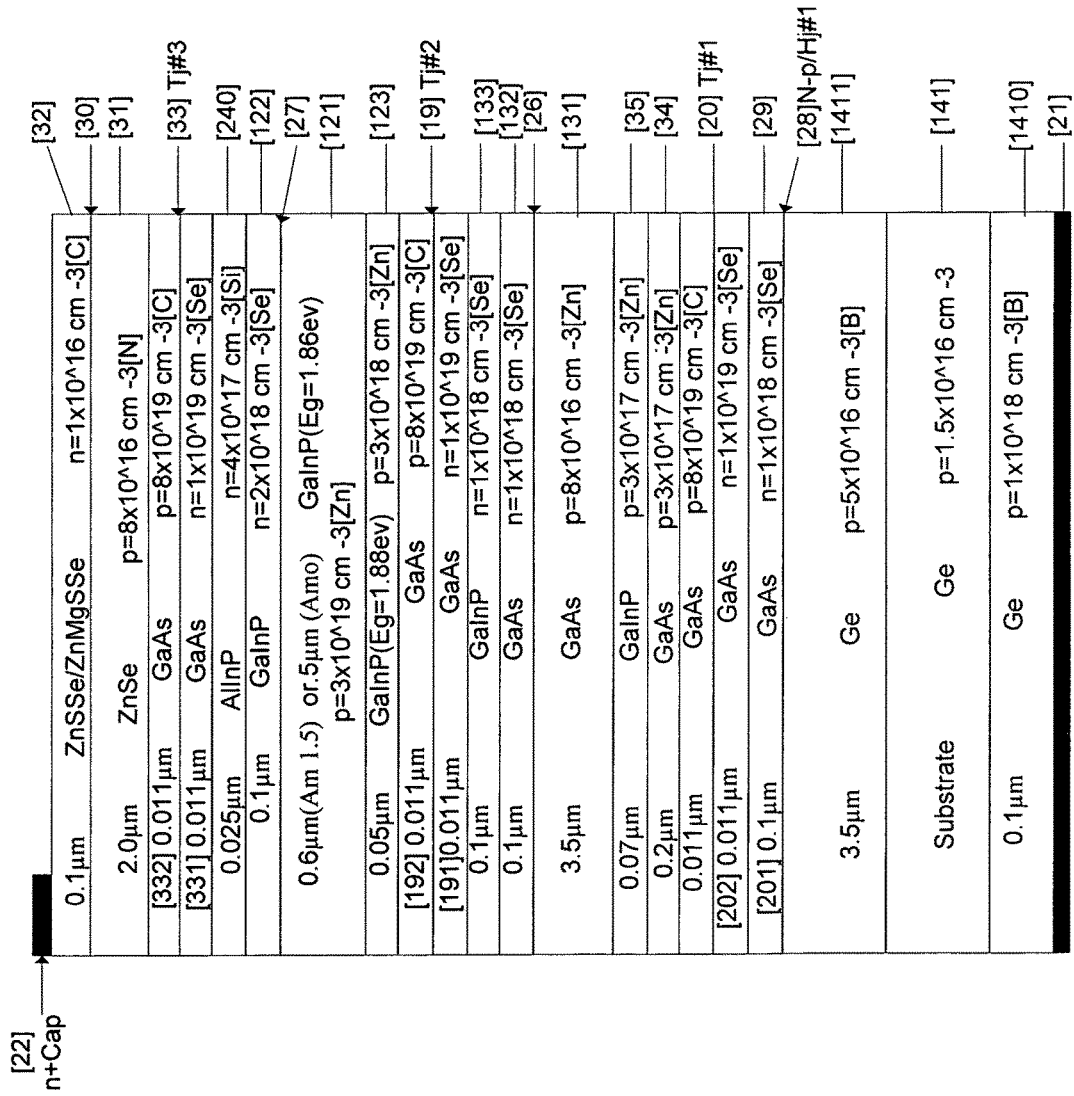
FIG. 4b is a cross-sectional schematic block diagram illustrating one embodiment of a tandem cell structure where n-p heterojunctions are used in addition to traditional two-homojunction GaAs and GaInP cells. This is in contrast to FIG. 4a in which only homojunctions are used.

Referring to FIG. 4(b), a tandem cell structure is illustrated where two n-p heterojunctions (28 and 30) are used in addition to traditional two homojunctions (26 and 27) for GaAs and GaInP cells. This is in contrast to FIG. 4a in which only homojunctions are used. Bottom most cell is a Ge heterojunction cell consisting of a Ge substrate 141, p-Ge buffer layer 1410 (optional), forming n-GaAs-pGe heterojunction (28) with n-GaAs window region. The other heterojunction in this structure is 30 formed between p-ZnSe layer 31 and n-ZnSSe or n-ZnMgSSe layer 32. It has two homojunction cells like FIG. 4a. These are 26 and 27, respectively. Homojunction 26 is formed using p-GaAs (131) and n-GaAs (132), and homojunction 27 is formed using p-GaInP (121) and n-GaInP (122). FIG. 4b does not show the use of RTS. It has three (19, 20, 33) n+-p+GaAs tunnel junctions. The constituent layers of tunnel junctions are shown as 191 and 192, 201 and 202, and 331 and 332.

In addition, buffer layers 240, 123, 34 and 35 are also shown. The top cap layer facilitating the Ohmic contact to layer 32 is shown as 22 which includes an Ohmic contact. The bottom Ohmic contact to Ge is shown as 21.

Figure 4C:
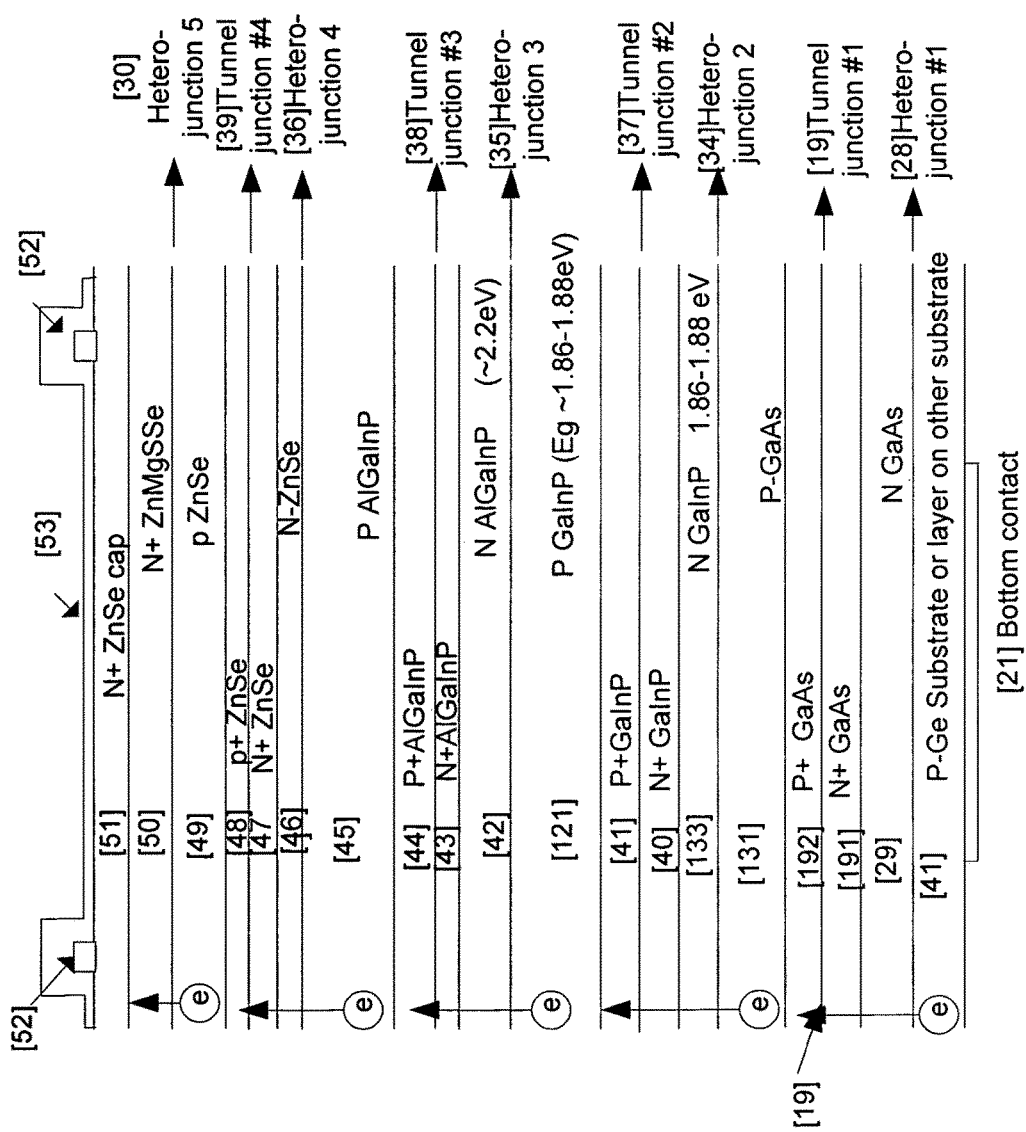
FIG. 4c is a schematic block diagram illustrating one embodiment of a 5-cell tandem structure using heterojunction cells.

Referring to FIG. 4c, a 5-cell tandem structure is illustrated using all heterojunction cells. From bottom going to the top antireflection coating, the first heterojunction 28 is formed between p–Ge substrate (141 or 141 and 1410 if a buffer is included as shown in FIG. 4b) and N—GaAs (29). The second heterojunction is 34 which is formed between p–GaAs (131) and N—GaInP (133). Each heterojunction and the layers forming it constitute a solar cell targeting a specific part of the solar spectrum. Sandwiched between two solar cells is tunnel junction#1 (19) which is formed by n+GaAs (191) and p+GaAs (192). The third heterojunction 35 is formed between p–GaInP (121) and a higher band gap layer such as n–AlGaInP (42). Tunnel junction#2 interfaces cell 2 and cell 3 and consists of n+GaInP (40) and p+ GaInP (41) layers. The fourth heterojunction 36 is formed between p-AlGaInP layer 45 and n–ZnSe layer 46. The tunnel junction#3 (38) consists of an n+AlGaInP layer (43) and a p+ AlGaInP layer (44). Heterojunction#4 (36) comprises of a p-AlGaInP layer (45) and an n–ZnSe layer (46). An n+ZnSe layer 47 and p+ZnSe layer 48 form the tunnel junction#4 (39). Tunnel junction #4 interfaces the cell 4 and cell 5. Cell 5 is comprised of heterojunction#5 (30) and its constituent layers p–ZnSe (40) and n-ZnMgSSe layer (50). Finally, there is an n+ZnSe thin cap layer (51) which facilitates formation of an Ohmic contact grid (52). The antireflection (AR) coating 53 is also shown. Similarly, a bottom Ohmic contact 21 is also shown.

Figure 4D:
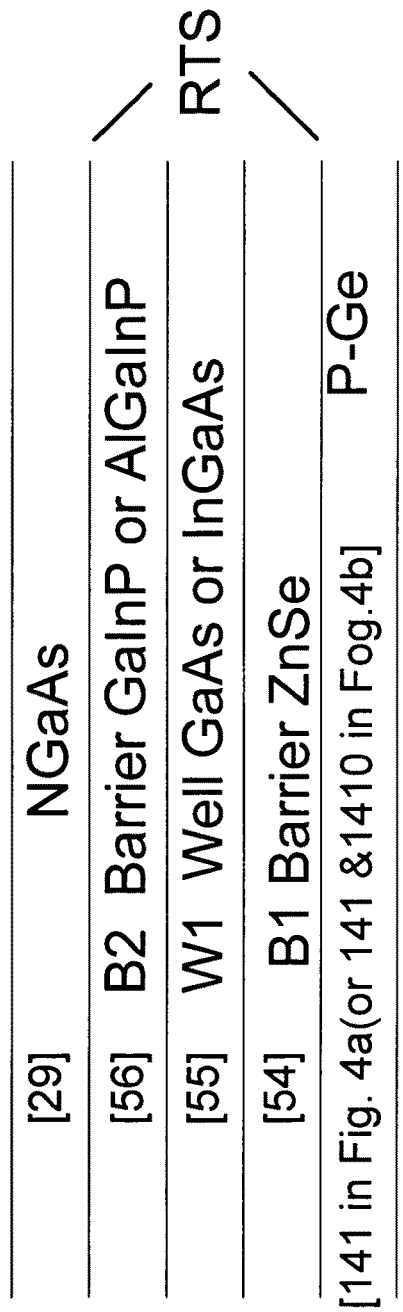
FIG. 4d is a schematic block diagram illustrating one embodiment of a RTS structure which is integrated between P—Ge layer and N—GaAs layers of Heterojunction#1 (of FIG. 4c).

Referring to FIG. 4d, a RTS structure which is integrated between the p–Ge substrate (141) and N—GaAs layer (29) forming the heterojunction#1 (28) (of FIG. 4c) is illustrated. The RTS is needed to provide conduction of both electrons and holes adequately for the functioning of the overall structure. The RTS consists of at least three layers (54, 55, and 56). Here, 54 and 56 serves as the quantum barrier layers and 55 as the quantum well layer. These layers are thin (30-80 Angstroms) and of energy gaps that result in good carrier transport (such as shown in FIG. 3). These layers should be compatible in terms of lattice constants and related strains and band gaps. In addition, their doping levels may be adjusted to provide appropriate band offsets or discontinuities in the conduction and valence bands.

Figure 4E:
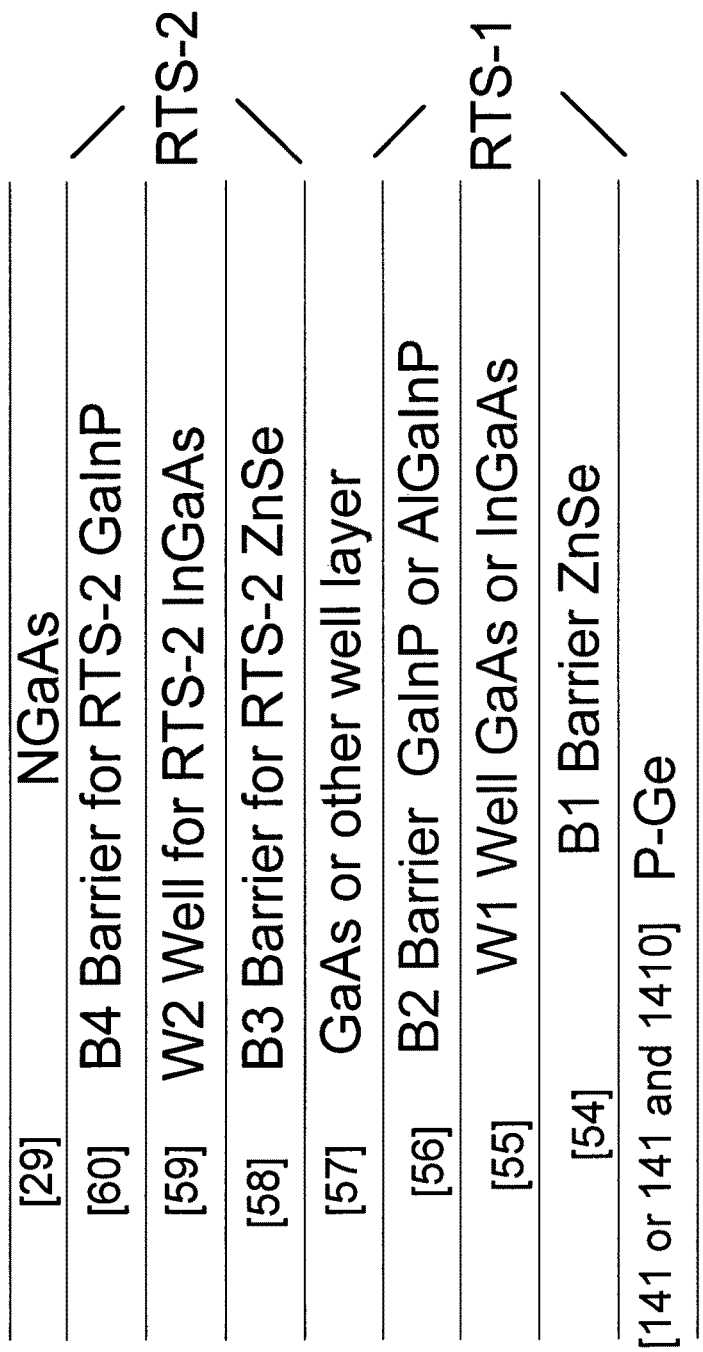
FIG. 4e is a cross-sectional schematic block diagram illustrating one embodiment of cascaded two RTS structures which are integrated between P—Ge layer and N—GaAs layers of Heterojunction#1 (of FIG. 4c).

Moreover, referring to FIG. 4e, a heterostructure is illustrated where two RTS structures are integrated between p–Ge substrate (141) [or p–Ge combination of substrate 141 and other layers (1410 and 1411)] and N—GaAs layer (29) forming a heterojunction (such as shown in FIG. 4c). Here, we have barrier#B1 54, well#1 55, barrier#B2 56, well#W2 57, barrier#B3 58, well#W3 59, barrier#B4 60. The use of cascaded resonant tunneling structures is stipulated to optimize the carrier transport at the heterointerface. The energy gaps, band offsets, and thickness of various wells and barriers are selected to optimize the flow of both types of carriers adequately.

Figure 5:
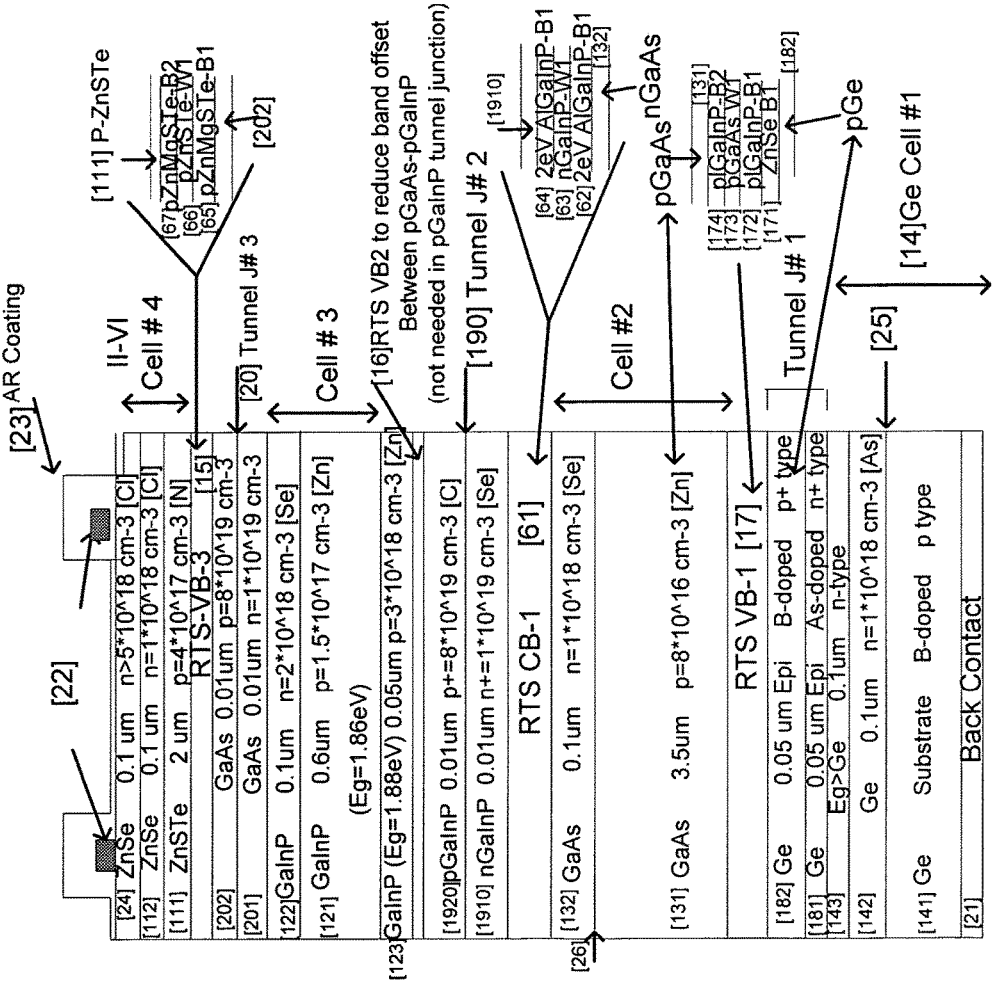
FIG. 5 is a cross-sectional schematic block diagram illustrating one embodiment of four cells integrated in tandem using tunnel junctions as well as detailed layering comprising resonant tunneling structures, where cell #4 is a heterojunction cell.

Referring to FIG. 5, four (4) cells integrated in tandem using tunnel junctions as well as detailed layering comprising resonant tunneling structures is illustrated, where cells#1-3 are homojunctions and cell #4 is a heterojunction cell. In this figure the tandem solar cell structure of FIG. 4a is shown with different types of RTS interfaces. Some RTS (such as 15, 16, and 17 are between p-lower energy gap/p-wider energy gap semiconductor interfaces involving valence band (VB) and other (such as 61) is between n-lower energy gap/n-wider energy gap involving the conduction band (CB) transport. As shown, the four (4) cells are integrated in tandem using tunnel and resonant tunneling structures [here 0.1 μm or 0.1 um is equal to 0.1 micron]. It should be appreciated that RTS VB-1 (17) means the Resonant Tunneling Structure (RTS) as shown in detail (as in inset), removes the blocking of current in the valence band. The RTS may be formed between pGe layer (182) and p–GaAs layer 131 as shown. In this case, the Resonant Tunneling Structure (RTS) has a very thin ZnSe buffer layer 171 which also serves as part of the barrier layer B1. The buffer layer may be introduced to facilitate deposition of a Group III-V material layer such as p–GaInP 172 (serving also as the part of barrier layer B1) over Ge. However, alternative methods resistant to forming antiphase domains may also be used. The other layers of RTS 17 are well W1 p–GaAs 173 and barrier B2 174 shown as p–GaInP. GaAs layer 173 may be substituted by GaInAs material depending on the current transport design. Details of RTS 61 between n–GaAs layer 132 and n+-GaInP (1910) is described next. It is comprised of barrier layer 62 (AlGaInP), well 63 (n–GaInP) and barrier 64 (AlGaInP). The barrier layers may be lightly n-doped if needed. Layers n+GaInP (1910) layer forms the tunnel junction 190 along with p+GaInP layer 1920. In FIG. 4a the tunnel junction 19 was formed between n+ GaAs (191) and p+ GaAs (192). To distinguish with GaInP layers we have used 190 (for GaInP based tunnel junction), 1910 and 1920 numbering. RTS#16 may be needed if the tunnel junction 2 is formed using GaAs layers (191 and 192 as shown in FIG. 4a). It is not needed the way tunnel junction is shown in FIG. 5a. FIG. 5a shows the incorporation of both GaInP tunnel junction 190 and GaAs tunnel junction 20 (between cell #3 and cell #4) comprising of n+GaAs (201) and p+GaAs (202). Tunnel junction#3 is incorporated between n–GaInP layer 122 and RTS#15. RTS#15 is comprised of a barrier layer 65 (B1 such as p-ZnMgSTe), a well W1 layer p-ZnSTe (66), and a barrier B2 layer p-ZnMgSTe (67). It should be noted that each RTS structure has two quantum barriers and one quantum well layers (cascaded RTS has more). However, their composition is different as identified by various layer numberings. RTS#15 and tunnel junction 20 facilitates transport between Cell #3 and Cell#4. Cell#4 is a heterojunction between pZnSTe layer 111 and n–ZnSe layer 112. The composition of ZnSTe (112) and GaInP (121), which determine their bandgaps, is determined by the optimization of the series current in their respective cells. Overall, optimum power output is obtained by combining all 4 cells. The cap layer n–ZnSe (24), top Ohmic contact 22, antireflection coating (23), and bottom/back Ohmic contact 21 are also shown.

In another embodiment, use of GaAs tunnel junctions as an alternate to GaInP tunnel junction (used in FIG. 5) is envisioned along with associated RTS structures. In addition, the top most cell could be realized using Schottky barrier interface or MIS (metal-thin insulator-semiconductor) interface.

Figure 6A:
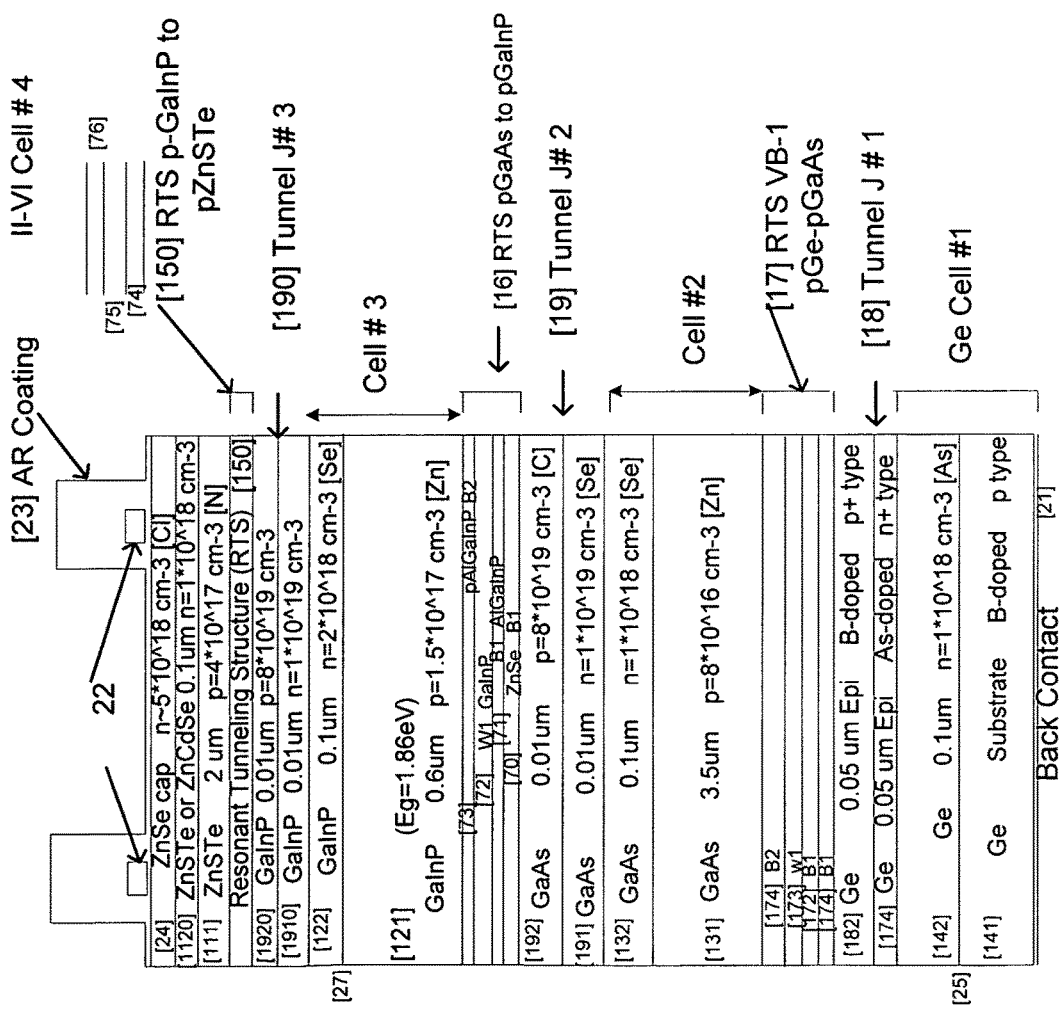
FIG. 6a is a cross-sectional schematic block diagram illustrating one embodiment of 4 tandem cells with cell #4 as a homojunction (i.e. ZnSeTe—ZnSeTe) and/or n–ZnCdSe/p–ZnSeTe cell without band offsets.

Referring to FIG. 6a, four tandem cells having integrated RTS and tunnel junctions. The layer numbering is similar to FIG. 5. Unlike FIG. 5, all layers [171 barrier, 172 barrier, 173 well and 174 barrier] of RTS VB-1 (17) are shown integrated in one structure. In addition, in place of GaInP based tunnel junction#2 (190) a GaAs-based tunnel junction#2 (19) [see FIG. 4a) is employed, illustrating flexibility afforded and adjustments commensurate to the technological feasibility. The layers comprising RTS 16 above the tunnel junction#19 outer layer p+GaAs (192) are as follows. Layer 70 (ZnSe) [whose role is to facilitate growth and serve as a barrier as well] and layer 71 [AlGaInP] serving as the first barrier B1, layer 72 well W1 (GaInP), and layer 73 (Al-GaInP) barrier B2. This RTS provides current flow between p+ GaAs (192) and p–GaInP (121). Similarly, the RTS (150), above the tunnel junction 190 (formed by n+GaInP layer 1910 and p+GaInP layer 1920), is shown in detail. An embodiment of RTS 150 (shown in inset) includes layer 74 (ZnSe serving as barrier B1), layer 75 well W1 (ZnSTe), and layer 76 barrier B2 (ZnSe or ZnMgSTe). In this structure, the II-VI cell#4 is realized using layer 111 (p–ZnSTe) and 1120 (n-ZnSTe). Alternately, layer 112 (n–ZnSe) could be used. Bottom/back contact (21), cap layer 24, top Ohmic contact 22, and AR coating 23 are same as before in FIG. 5a.

Figure 6B:
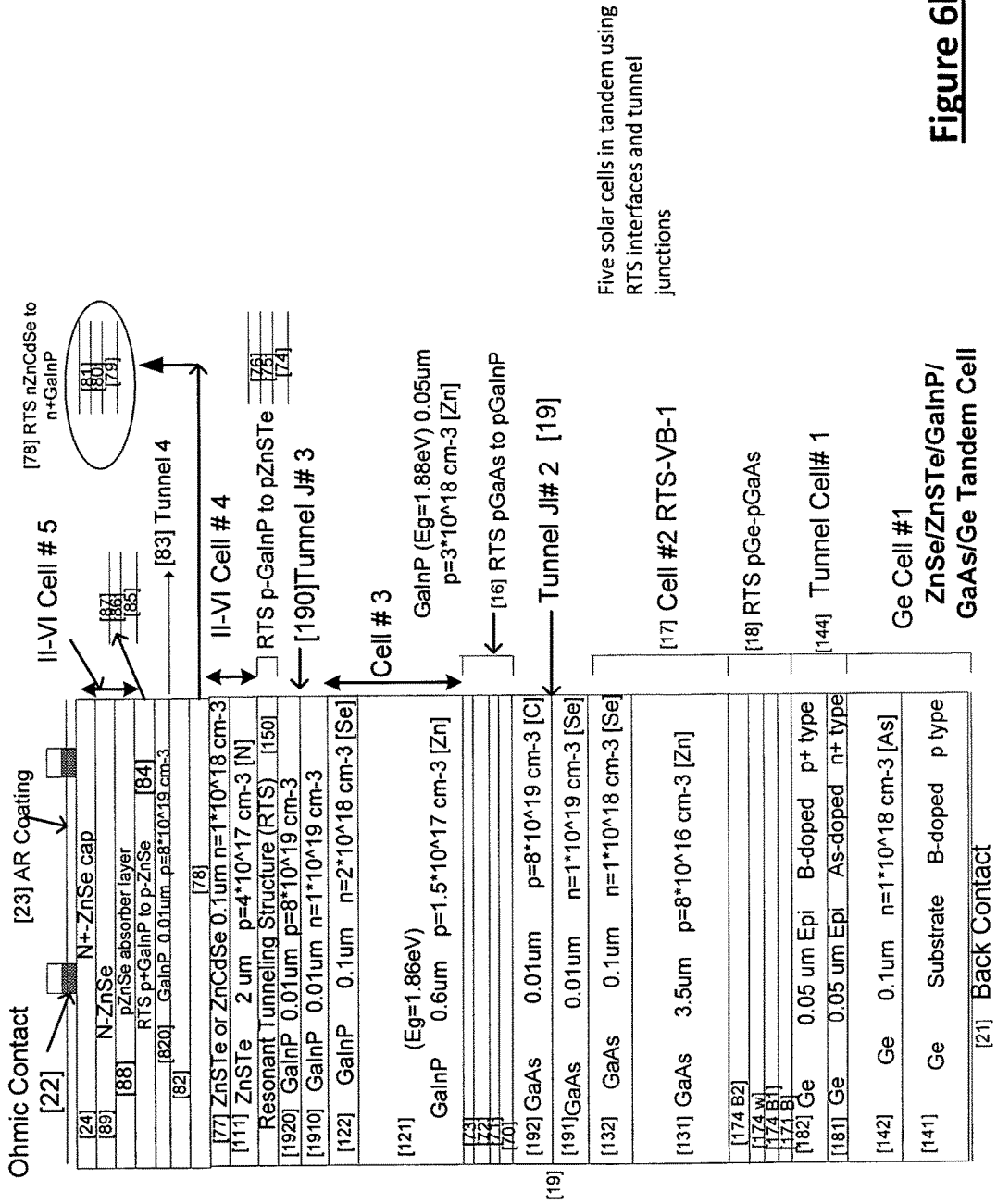
FIG. 6b is a cross-sectional schematic block diagram illustrating one embodiment of five solar cells in tandem using RTS interfaces and tunnel junctions.

FIG. 6b illustrates five solar cells in tandem using two Group II-VI material cells employing RTS interfaces and tunnel junctions for integration. The structure is similar to FIG. 6a up to cell #4 layer 111 (p–ZnSTe). This structure shows the situation when a tunnel junction on n+ZnSTe and p+ZnSTe is not technically possible. In this situation, the usage of a RTS structure is illustrated. (Note ZnSTe can be replaced by ZnCdSe with similar band gap, if technology permits). Layer 111 has on top of it n+ZnCdSe layer (77). This is followed by a RTS structure (78) between n+ZnCdSe layer (77) and n+GaInP layer (82). This RTS structure 78 is comprised of a barrier 79 (selected from a list of n–ZnSe, n-ZnSSe, and n-ZnMgSSe), well 80 (ZnCdSe), and another barrier 81 (selected from a list of n–ZnSe, n-ZnSSe, and n-ZnMgSSe). The RTS is designed to provide low voltage drop across RTS for the operating current of the entire solar cell structure. Layer 820 (p+GaInP) form the tunnel junction (83). RTS structure (84) in the valence band facilitates current flow from layer 820 to p–ZnSe absorber layer (88) of Cell #5. RTS 84 has again at least 2 barrier layers and one well layer. The first barrier layer (85) is p-ZnMgSSe, the well (86) [selected from a list of p–ZnSe, ZnCdSe, and ZnSTe], and barrier (87) p-ZnMgSSe. Cell #5 is formed between p–ZnSe (89) and the window region n–ZnSe (90). The cap layer is n+ZnSe (24). The front Ohmic contact 22 is formed on layer 24. AR coating is 23, and the back contact is 21.

Figure 7A:
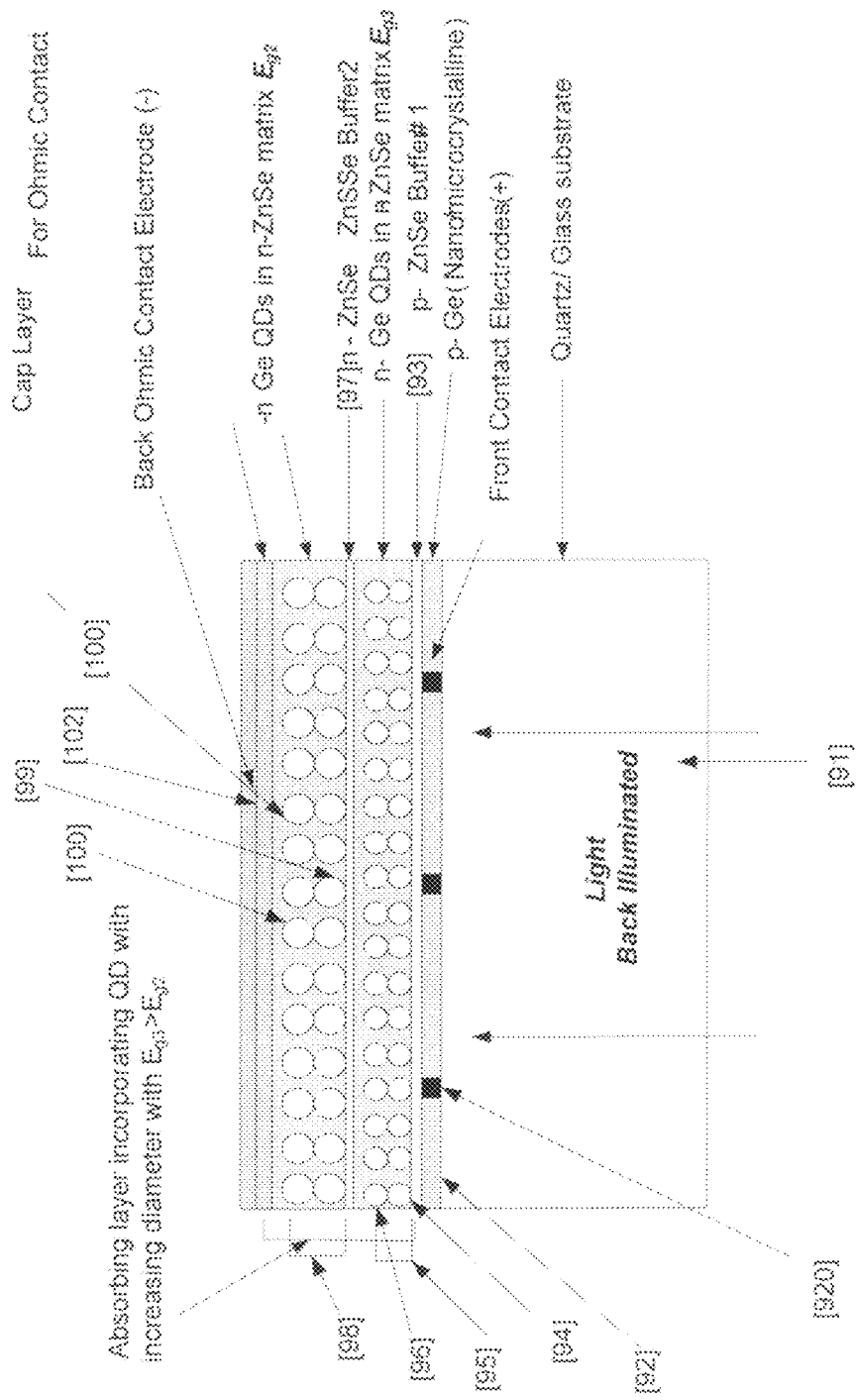
FIG. 7a is a cross-sectional schematic block diagram illustrating a cross-section of one embodiment of a single junction quantum dot based solar cell structure realized on a quartz substrate using self-assembled quantum dots in a ZnSe matrix.
Figure 7B:
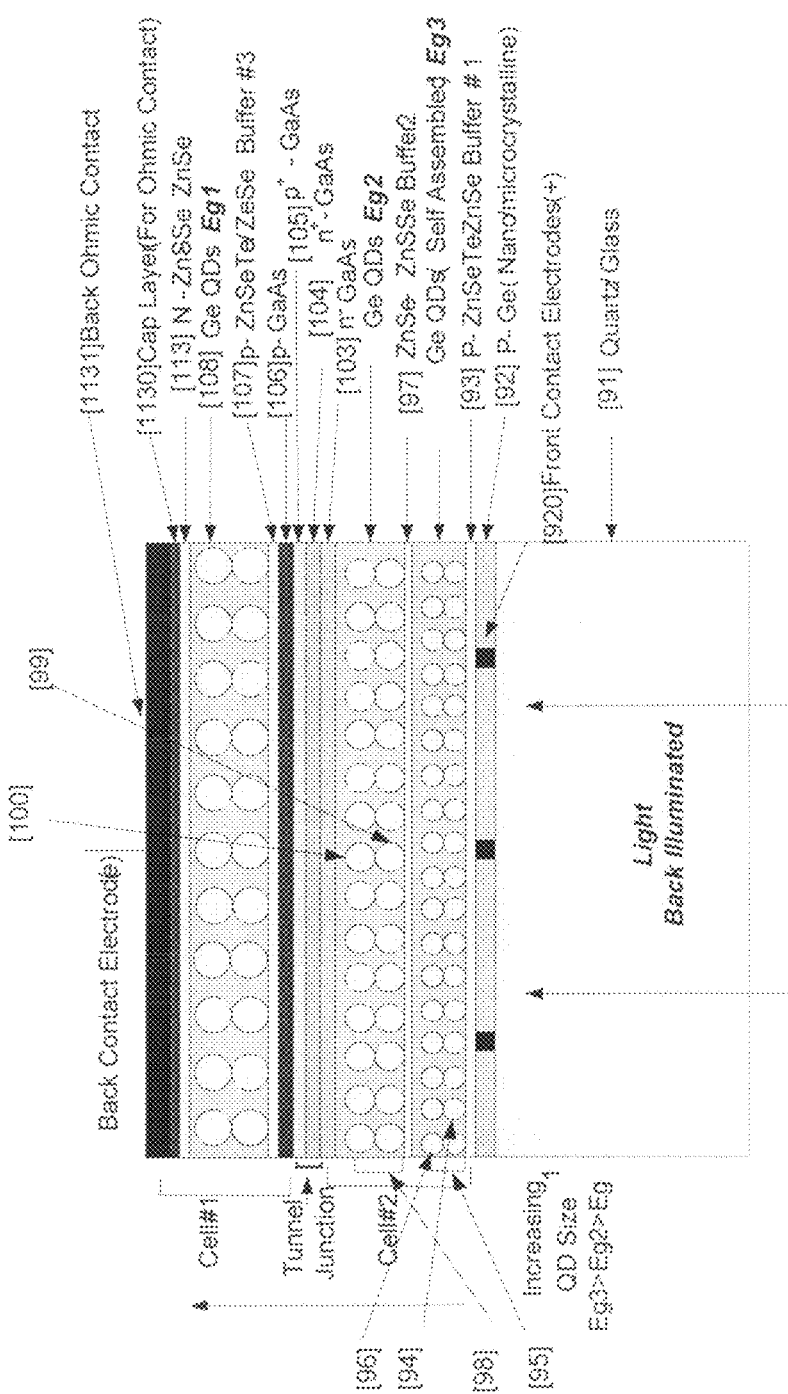
FIG. 7b is a cross-sectional schematic block diagram illustrating one embodiment of a back-illuminated tandem two cell structure realized on a quartz substrate using self-assembled quantum dots (three dot sizes with reducing energy gaps) harnessing three spectral ranges (no RTS interfaces are shown here).

Referring to FIG. 7a, it shows the cross-sectional schematic of a single-junction quantum dot based solar cell structure which is realized on a quartz or glass substrate 91. A layer of p–Ge (92) is grown on the substrate. This layer 92 is selected from a list such as amorphous-pGe, polycrystalline or nanocrystalline p–Ge. It has a highly doped region forming the grid, shown as 920. Light is illuminated through the glass substrate. A thin buffer layer, selected from p–ZnSe, p-ZnSeTe, ZnSTe, layer (93) is grown on p–Ge layer. GeOx-cladded Ge quantum dots (94) are self-assembled in a layer (95). GeOx can be desorbed from Ge dots and a thin layer (96) of wide gap semiconductor (such as n–ZnSe or undoped ZnSe or ZnSSe) is grown. This layer serves as a matrix which hosts Ge quantum dot layer (95). This is followed by self assembly of another set of GeOx-cladded Ge dot layer 98 in which quantum dots 99 are of larger diameter than dots 94. The desorption of GeOx is followed by the growth of another n–ZnSe or undoped ZnSe layer 100. A highly doped cap layer 101 is deposited to form the back Ohmic contact 102. FIG. 7b shows a tandem two cell structure having a tunnel junction. The structure is realized on a quartz substrate (91) using self-assembled quantum dots (three dot sizes) with reducing energy gaps harnessing three spectral ranges (no RTS is shown here). The structure is similar to FIG. 7a up to layer 100 (n–ZnSe). An n–GaAs layer (103) is grown at low temperature. This is followed by layer 104 (n+GaAs) and 105 (p+GaAs) which form the tunnel junction. A thin layer of p–GaAs or p-Al-GaAs or p-GaInp (106) is deposited. This layer has another layer of p–ZnSe (107). The two p– layers serve to self-assemble another set of GeOx-cladded Ge dot layer 109 having dots 108 which have an effective band gap smaller than the other dots. Again the GeOx cladding is desorbed and a host lightly n-doped or undoped ZnSe layer (110) is grown. This is followed by layer 113 which is n-doped. The layer 1130 of n+ZnSe serves as the cap layer, and an Ohmic contact 1131 is formed. The illumination is from the substrate side.

Figure 8:
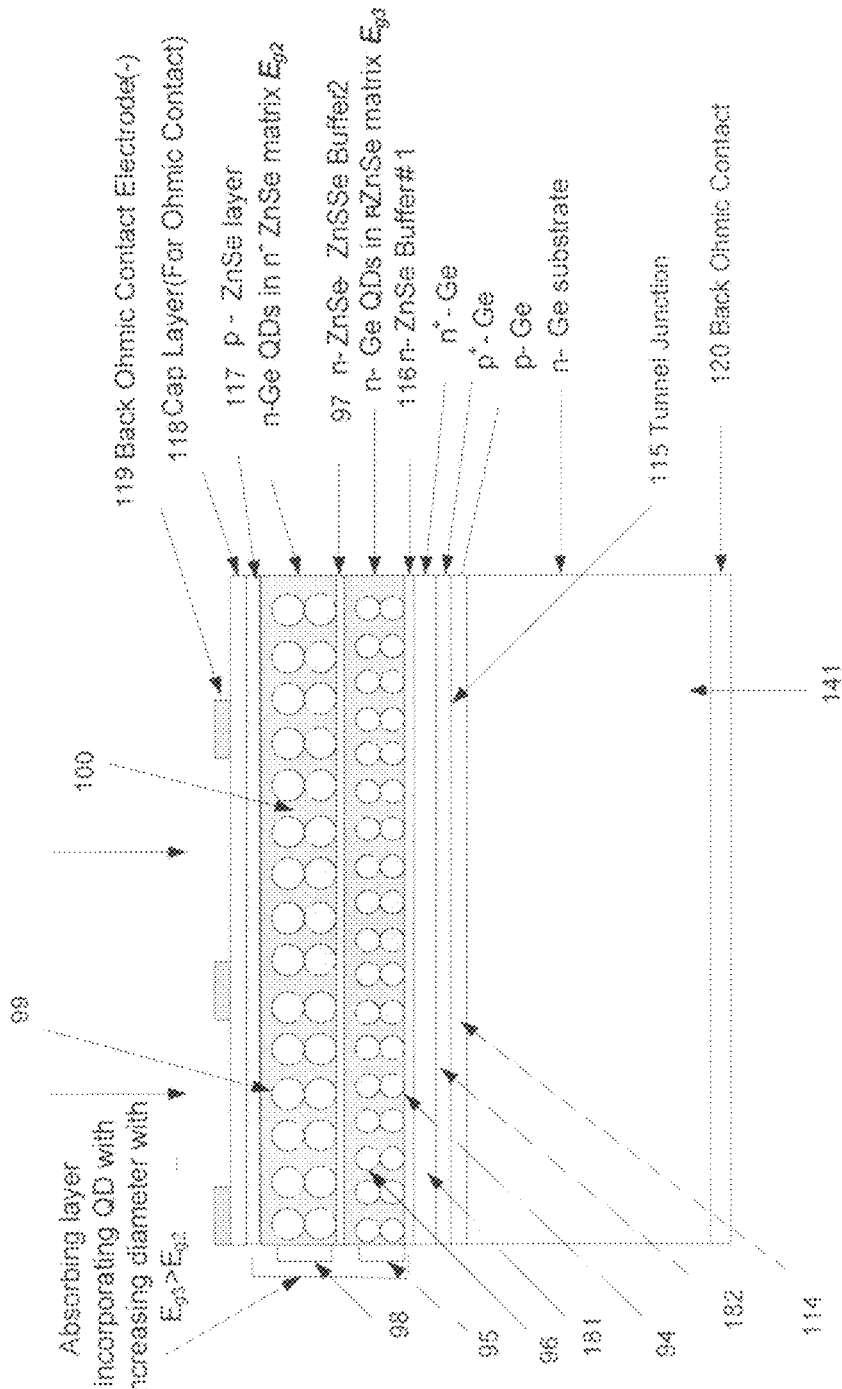
FIG. 8 is a cross-sectional schematic block diagram illustrating one embodiment of a front illuminated tandem cell comprising a Ge homojunction bottom cell and a top quantum dot cell having at least two sizes of nanodots. The substrate may be single crystal germanium. Here, although no RTS interface is shown, at least one may be utilized.

FIG. 8 illustrates a front illuminated tandem cell comprising a Ge homojunction bottom cell and a top quantum dot cell having at least two sizes of nanodots. Various other size nanodots may also be employed. Although the substrate (141) as shown is a single crystal germanium, other substrates may be used suitable to the desired end result. Layer 114 is n–Ge forming a solar cell using homojunctions. Layers 181 (n+Ge) and 182 (p+Ge) forming the tunnel junction 115. A p-type interfacial layer 116 (selected from a wider gap material such as p–ZnSe) is deposited. This is followed by the self-assembly or growth of a layer 95 of cladded GeOx-Ge quantum dots 94. Upon removal of cladding, a layer 96 of wider gap material such as undoped or lightly n-doped ZnSe is grown which also forms the host matrix surrounding the Ge dots. This is followed by self assembly of another set of GeOx-cladded Ge dot layer 98 in which quantum dots 99 are of larger diameter than dots 94. The next step is desorption of GeOx which is followed by the growth of another n–ZnSe or undoped ZnSe layer 100. A p-type layer 117 (such as ZnSe or other semiconductors) can now grown forming the window region of the heterojunction. A highly doped p+ layer 118 is deposited to facilitate forming the top Ohmic contact 119. The back contact 120 provides another terminal of the tandem solar structure. In this case, this structure does not use an RTS structure, although such a structure may be incorporated as desired. Unlike Si, Ge (though an indirect material with $E_g$=0.67 eV) also has a direct gap (0.88 eV), thus absorbing photons in a very thin layer as compared to Si.

Figure 9A:
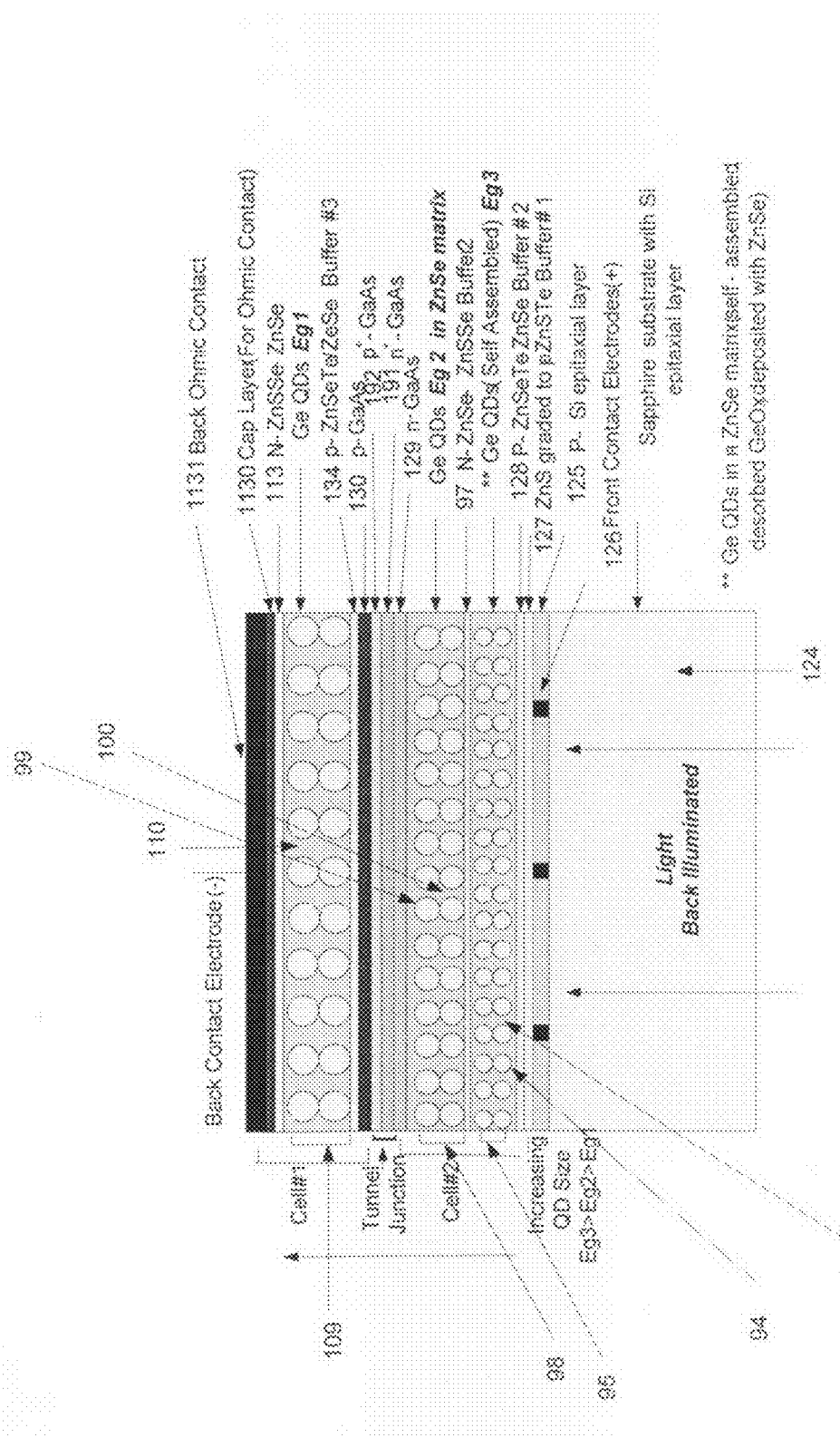
FIG. 9a is a schematic block diagram illustrating a cross-section of one embodiment of a two junction tandem cell comprising Ge quantum dots in ZnSe based matrix realized on a Silicon-on-sapphire substrate. Si on glass or other substrates may also be used.
Figure 9B:
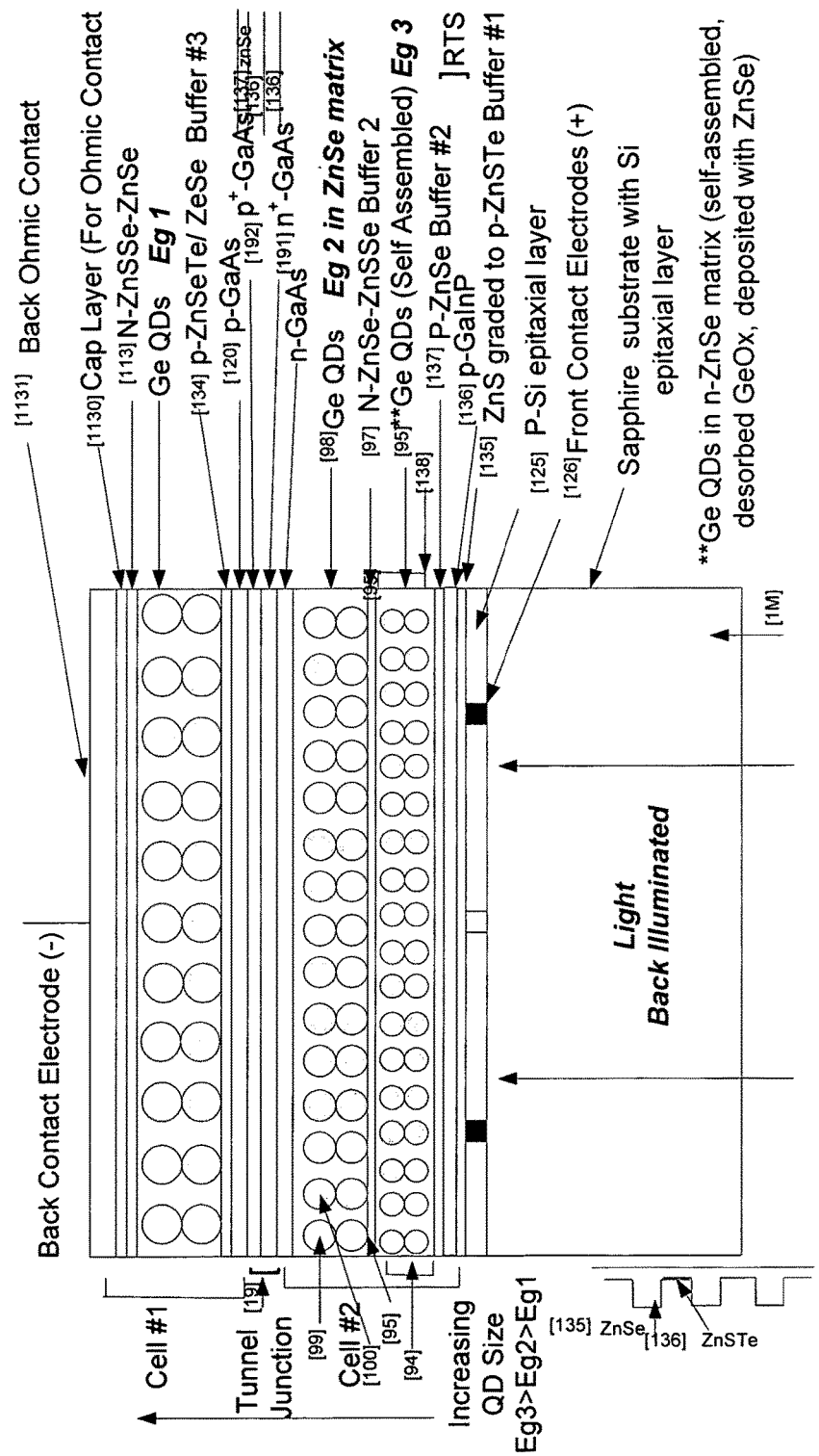
FIG. 9b is a schematic block diagram illustrating one embodiment of a RTS structure incorporated under the first set of quantum dots.

Referring to FIG. 9a, a two junction tandem cell comprising Ge quantum dots in a ZnSe based matrix realized on a Si film 125, in turn grown on a transparent substrate 124. The semiconductor film-substrate combination is selected from a list including silicon-on-sapphire, Si-on-quartz, etc.). A highly doped region 126 serves as the front contact in the form of a grid permitting sun light. Layer 125 has either a RTS (not shown) or a graded layer region. The ZnS (lattice matched to p–Si) buffer layer may be graded to p–ZnSTe 127, upon which layer 128 (p–ZnSTe graded to p–ZnSe) is formed. Layer 128 has a layer 95 of self-assembled Ge quantum dots (94) in a ZnSe layer 96 serving as matrix hosting quantum dots (as described in FIGS. 7 and 8). There is a thin lightly doped or undoped buffer layer 97 upon which is self assembled another layer 98 of quantum dots 99 (different in size than dots labeled as 94). A ZnSe layer 100 serving as matrix hosting the Ge dots 99. An n–GaAs layer 129 is deposited on layer 100. Layer 129 hosts a tunnel junction 19 formed between n+GaAs layer 191 and p+GaAs layer 192. A p–GaAs layer 120 serves as the base on which Ge quantum dots 108 are assembled forming a layer 109. This layer (as described before) is hosted in a ZnSe layer 110. Upon this layer a n–ZnSe or ZnSSe layer 113 is formed. Layer 113 is deposited with a highly doped cap layer 1130 on which the back Ohmic contact 1131 is formed. It should be appreciated that these variable-sized dots may be used to represent various band gaps ($E_{g1}$, $E_{g2}$, $E_{g3}$ as shown in FIGS. 7, and 8) for photon absorption like tandem cells. Referring to FIG. 9b, an RTS structure incorporated under the first set of quantum dots. The RTS 139 is comprised of a barrier layer 135 (ZnS), a well layer 136 (ZnSTe), and a barrier layer 137 (p-ZnSe) layers. This RTS is designed to provide a low-voltage drop structure between p-Si layer 125 and layer 138 upon which quantum dot layer 95 is assembled. Layer 138 may be selected from a list of semiconductors p-Ge, p-GaAs, p-GaInP, GaInAs). Other layers are similar to FIG. 9a.

Figure 10:
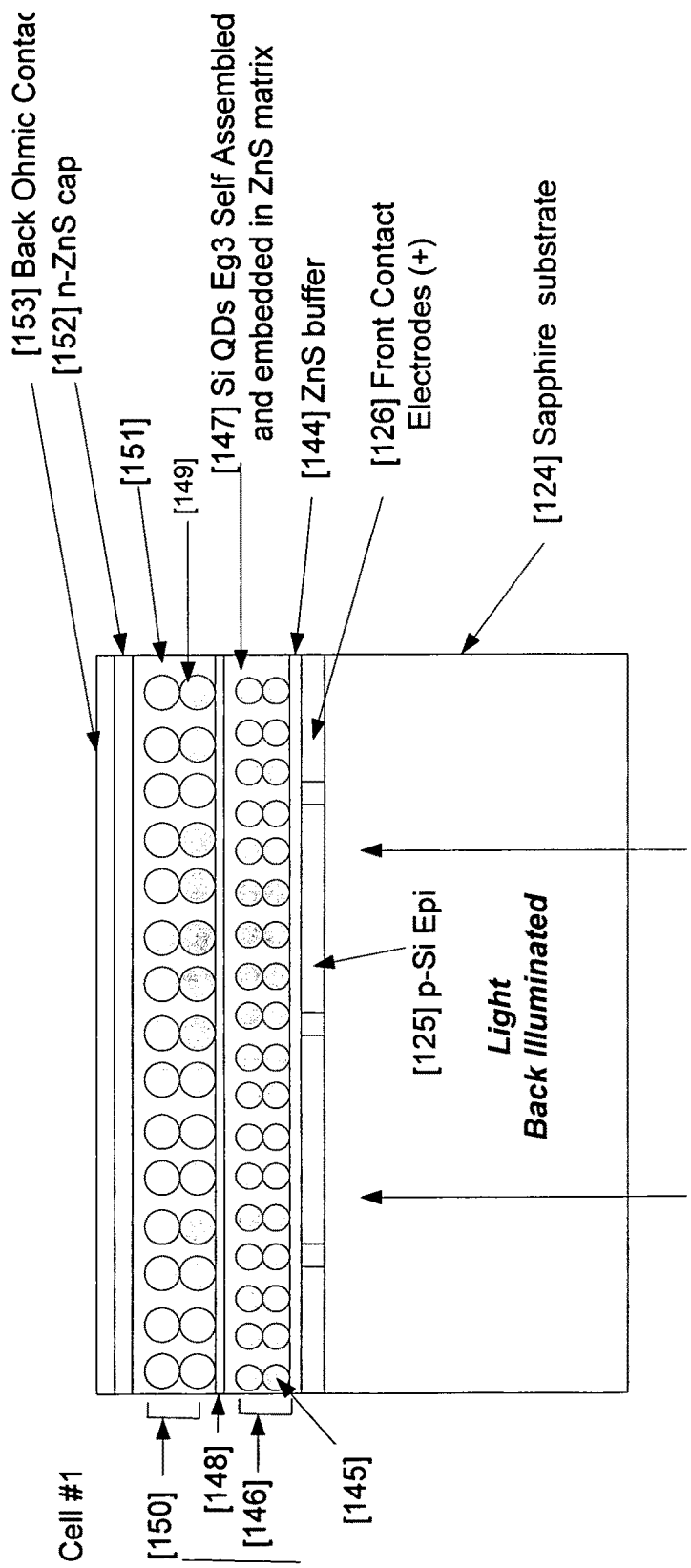
FIG. 10 is a schematic block diagram illustrating one embodiment of a back-illuminated Si quantum dots in ZnS matrix in a single cell configuration on Si-on-sapphire substrate.

Additionally, referring to FIG. 10, back-illuminated Si quantum dots in a ZnS matrix in a single cell configuration on Si-on-sapphire substrate is illustrated. Here, sapphire substrate 124 hosts an epitaxial Si layer 125. p+ doped grid is formed in 125 to serve as the Ohmic contact 126. A layer 144 serves as a buffer layer. A layer 146 of Si quantum dots 145 is deposited along with a host 147 selected from semiconductors ZnS, ZnMgS. The dots are n-type. In case the dots are SiOx cladded, efforts are made to remove or desorb the oxide cladding to deposit the host 147 which electrically separates dots from each other. Layer 148 is a thin buffer layer selected from lightly doped n-ZnS, ZnMgS. Another layer 150 of Si dots 149 (having different size and band gap than dots in layer 146) is deposited on the buffer layer 148. The dots are hosted in a matrix 151, which is selected from a list such as ZnS, ZnMgS, and other compatible semiconductors. Layer 152 (shown as n-ZnS) forms the highly conducting cap layer on which back Ohmic contact 153 is formed. If needed an appropriate RTS interface may be introduced in this structure like FIG. 9b.

Figure 11:
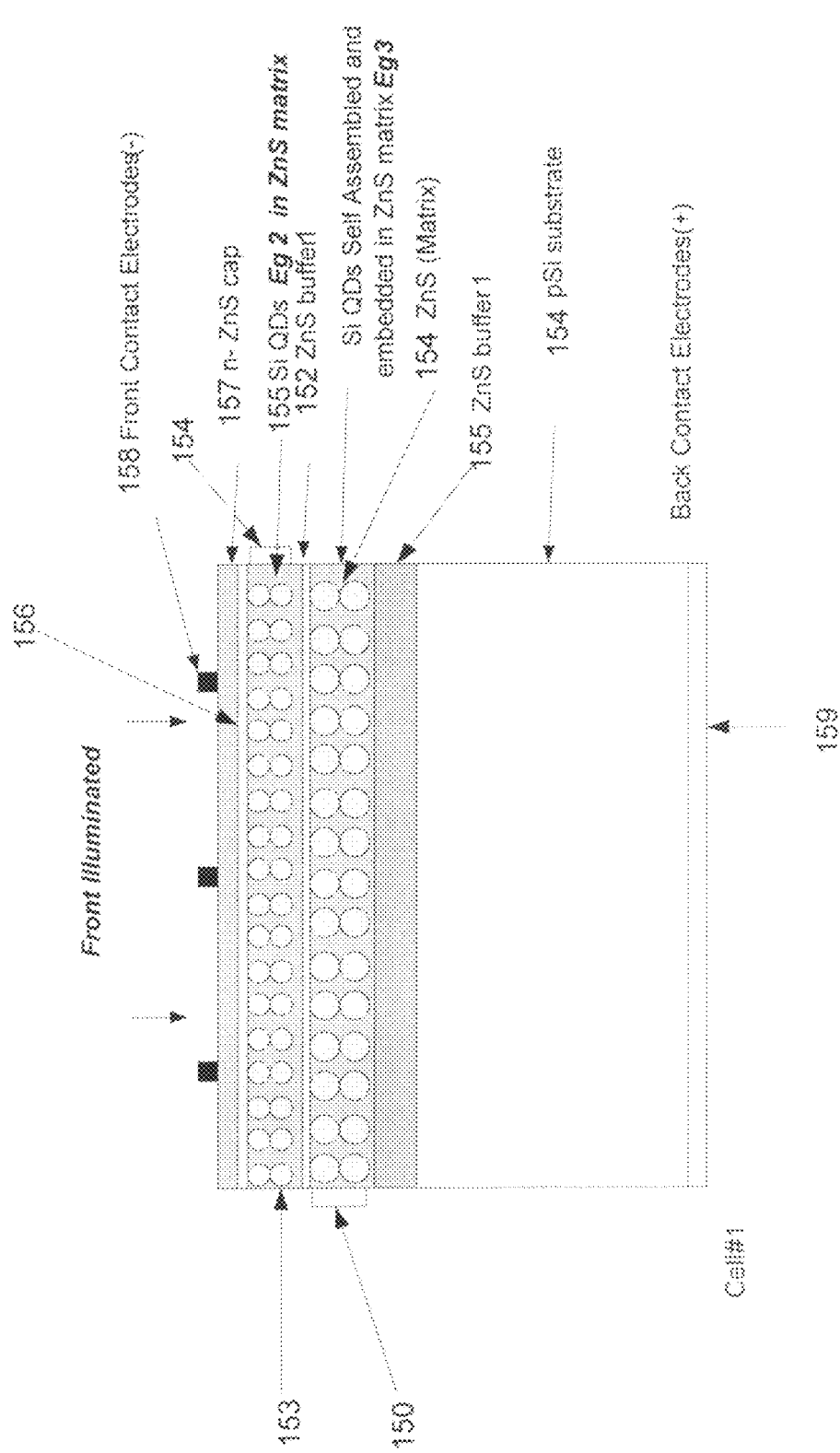
FIG. 11 is a schematic block diagram illustrating a cross-section of one embodiment of a front illuminated cell having quantum dot on Si substrates. Polycrystalline Si substrates are also envisioned and may be used.

Furthermore, as shown in FIG. 11, a front illuminated cell having quantum dot on Si substrates is further contemplated (Polycrystalline Si substrates are also envisioned).

Figure 12A:
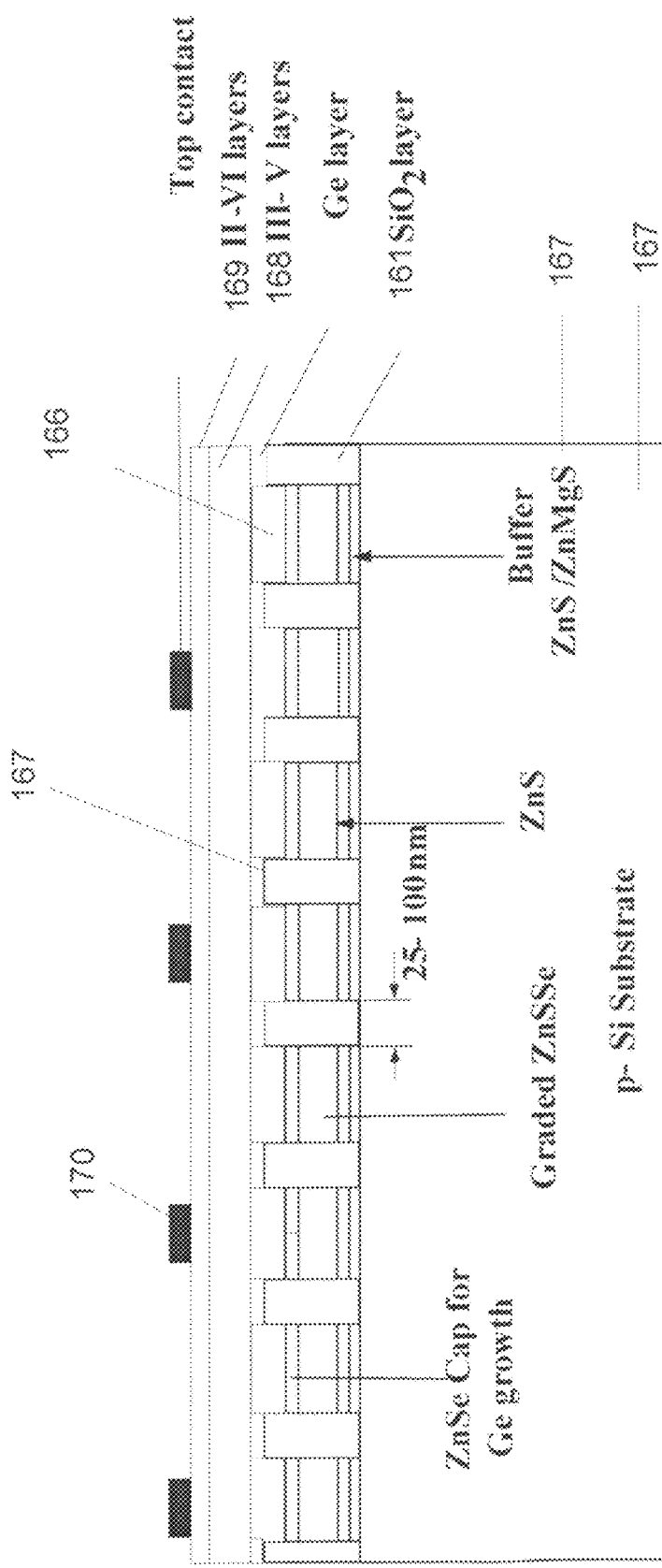
FIG. 12A is a schematic block diagram illustrating one embodiment of a Lateral epitaxial overgrowth of Ge epi layer on Si substrates using II-VI buffer layers. Ge layer may be used as a starting point for tandem cells as shown and described herein.

FIG. 12a illustrates a methodology in which a dislocation-minimized lateral epitaxial overgrowth (LEO) of a Ge layer on a Si substrate, using Group II-VI material buffer layers, is illustrated. It should be appreciated that a Ge layer may be used as a starting point for tandem cells realized in III-V and II-VI semiconducting layers as shown and discussed in FIGS. 4-6 and others. The method(s) disclosed herein enables the fabrication of high efficiency solar cells, having multiple tandem cells, using materials such as Si that are abundant in nature. Both polycrystalline and single crystal cells are also envisioned. A typical process may incorporate the following steps:
  (a) Pattern SiO$_2$ (161) is grown on a Si substrate (160) using 22 nm or smaller size lithography;
  (b) Grow or deposit at low temperatures a buffer ZnS layer 162, a ZnMgS layer 163, a graded ZnSSe layer 164 and finally a ZnSe layer 165.
  (c) Heat treat the grown II-VI layers (such as described for post heteroepitaxial patterning, PHP) to glide dislocations from the II-VI transition layers into SiO$_2$ walls;
  (d) A Ge layer is grown on layer 166 between openings in SiO2 layer 161. This is followed by lateral epitaxial overgrowth (LEO) 166 of this layer on adjacent SiO2 regions. Depending on the LEO characteristics [8], the material for layer 166 can be selected from Ge, ZnSe, ZnSSe, GaAs, and GaInAs. The primary aim is to have dislocation density in layer 166 and 167 to be as small as possible. This layer is now used as a high quality Ge base layer on which tandem cells like FIG. 4-6 are grown, and
  (e) Build lattice-matched III-V 168 and II-VI 169 solar cell structures on layer 167. Here details of layers 168 and 169 are not shown.

The layer 167 forms the base layer over which Groups III-V and II-VI material layers, configured as tandem solar cells, are grown.

Figure 12B:
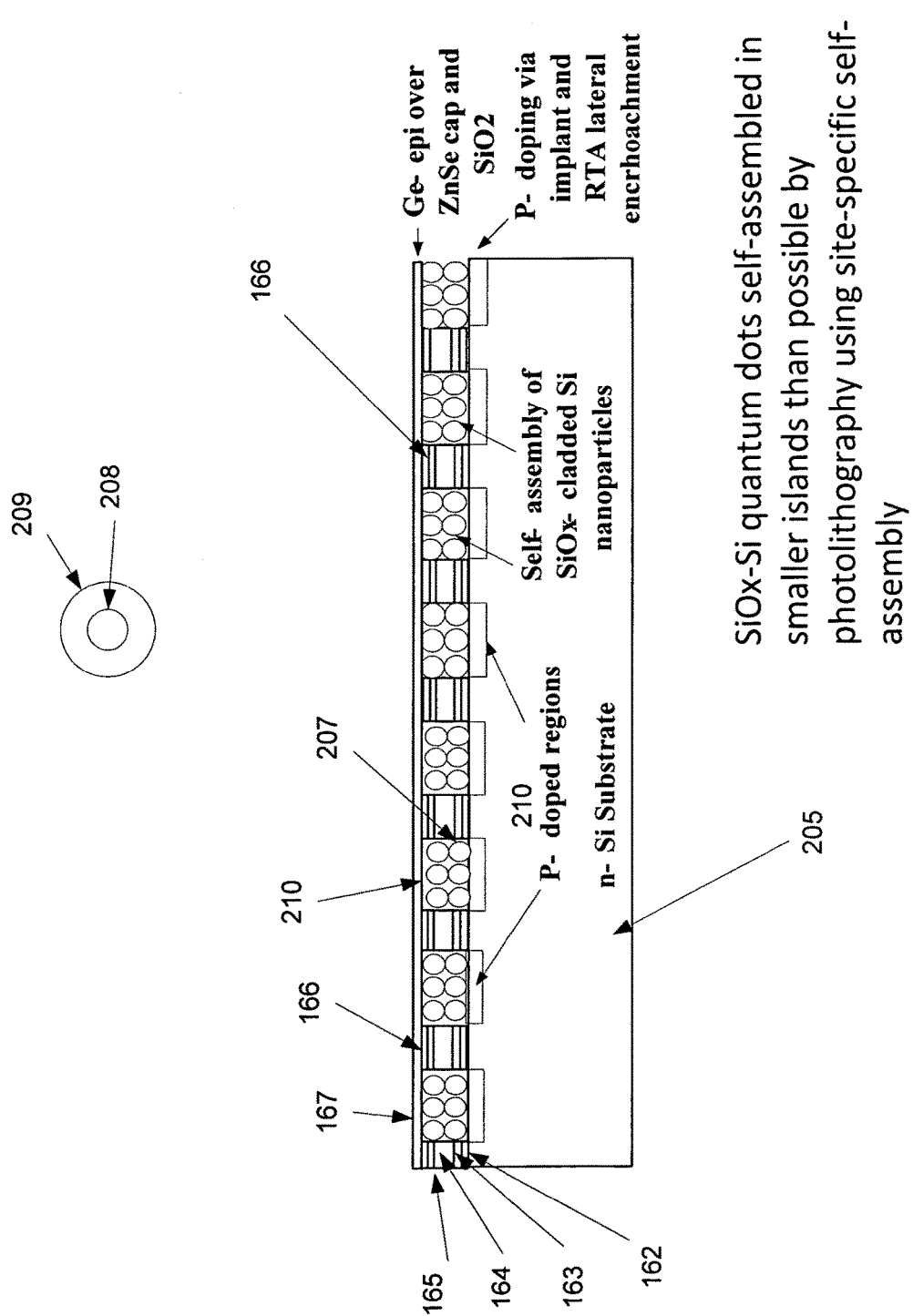
FIG. 12B is a schematic block diagram illustrating one embodiment of $SiO_x$—Si quantum dots self-assembled in smaller islands (than is possible by photolithography using site—specific self-assembly).

Referring to FIG. 12b, SiO$_x$—Si quantum dots are self-assembled in smaller islands over p-doped regions [17] than is possible by lithography using site-specific self-assembly. In this case, the n-Si substrate 205 may first be patterned in n- and p-regions (206) using ion implantation in the lithographed SiO$_2$ (not shown here). The dimensions of p-regions may be laterally increased (and n-region reduced than obtained by lithography) by using rapid thermal annealing (RTA) causing lateral diffusion of p-impurities. SiO$_x$-cladded Si nanodots (207) are then self-assembled on the p-regions 206 forming a layer 210 consisting of many dot layers (two dot layers are shown; SiOx cladding 209 over a Si dot, like an isolated dot 208, is not shown explicitly). Following an annealing step, the p-region has SiO$_x$—Si layers whose thickness may be dependent on the time of self-assembly. Now various Group II-VI material layers (162, 163, 164, and 165, as shown in FIG. 12a) are grown on the n-regions having no SiOx-Si dots. Selective area epitaxial regions consisting of 162-165 may now be processed (e.g. annealed), where this processing slides the dislocations existing in 162-165 layers (due to lattice mismatches and other causes) into the oxide regions. This may be followed by deposition of layer 166 (selected from Group III-V, II-VI, and Ge), and eventual lateral epitaxial overgrowth over the regions 210. In this figure, we have shown a Ge layer grown on the ZnSe cap. Like figure, 12a, III-V and II-VI solar cells can be formed on layer 167.

In accordance with the invention, details of an alternate processing sequence are outlined below:
  Process Step I:
    (a) Pattern n-Si substrate using 45 nm patterns (as an example) on SiO$_2$;
    (b) Ultra-low energy (ULE) p-type implant and rapid thermal annealing (RTA) to form larger 67.5×67.5 nm (as an example) than lithographed (45×45 nm) p-regions (and smaller 23 nm×23 nm than lithographed n-regions); (in one embodiment squares of n-regions surrounded by p-regions are formed);
    (c) Remove SiO$_2$ mask and grow ZnS/ZnMgSe layers and other ZnSSe transition layers.
  Process Step II:
    (d) Open larger islands 67.5 nm×67.5 nm (45+22.5 nm=67.5 nm) using alignment marks over the p-Si doped regions;
    (e) RIE etching of the II-VI layers to Si (p-Si doped layer);
    (f) Deposit SiO$_2$ or self-assemble SiOx-cladded Si nanocomposites of appropriate thickness; and
    (g) Heat treat to consolidate SiOx-cladded Si nanodots to from pin hole free SiOx layer. Continue heat treatment to glide dislocations in II-VI regions now left on n-Si.
  Process Step III:
    (h) Nucleate Ge layers on ZnSe (or ZnSSe) layer using, for example, ultra-high vacuum chemical vapor deposition (UHV-CVD) or other technique(s) suitable for achieving lateral epitaxial overgrowth on SiOx-Si regions surrounding epitaxial II-VI layers. III-V layers are also envisioned on II-VI layers to form epitaxial overgrowth. This could be followed by Ge growth forming the base layer for subsequent III-V and II-VI solar cells.

Figure 13:
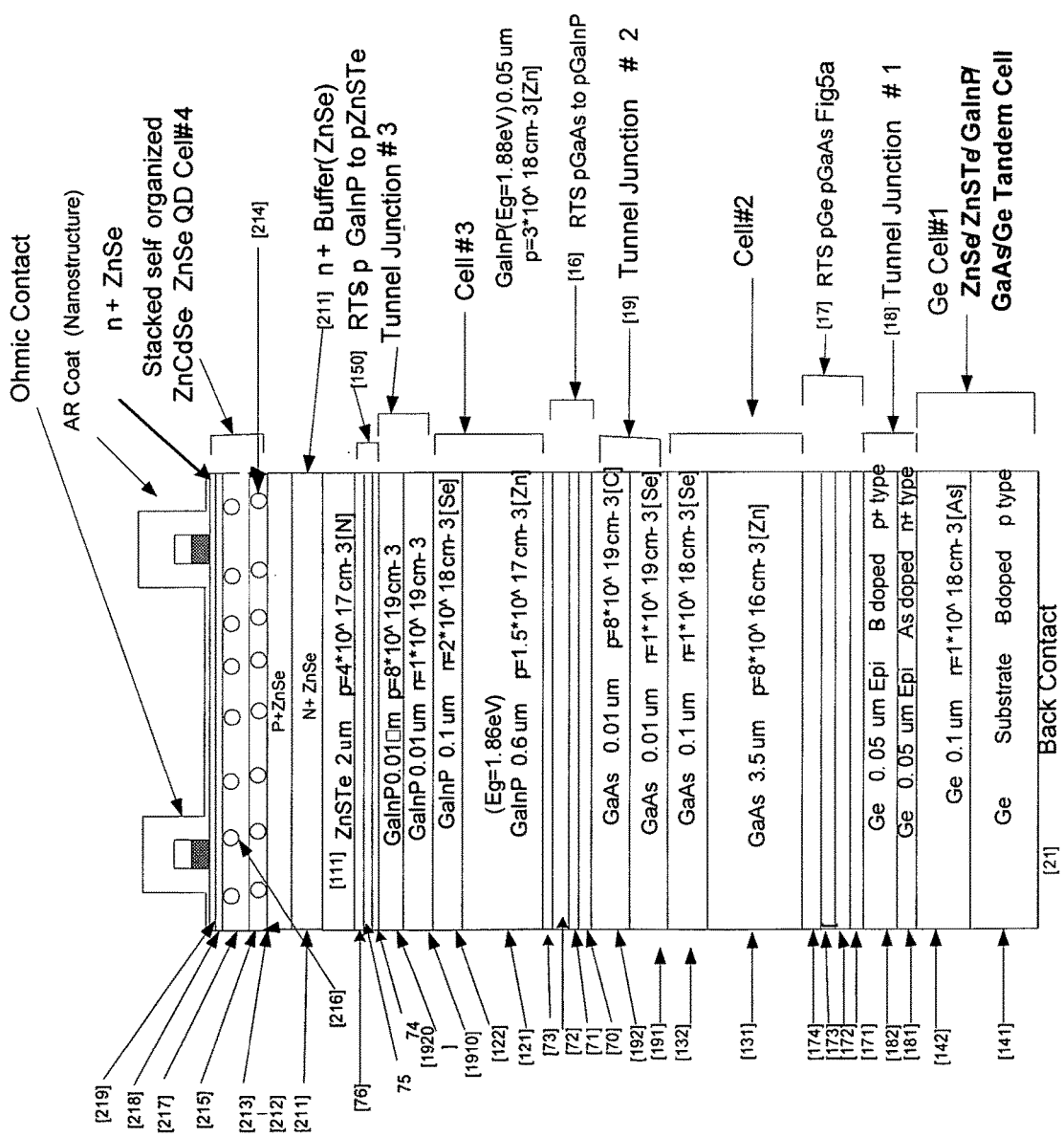
FIG. 13 is a schematic block diagram illustrating one embodiment of a tandem cell with epitaxial p-n junction and self-organized quantum dot forming the absorption region. The cells are shown interfaced using RTS and tunnel junction cells.

Referring to FIG. 13, a tandem cell with three p-n homojunction cells using Ge, GaAs, and GaInP and one heterojunction p-ZnSTe or p-ZnCdSe (layer 111)/n+-ZnSe or ZnSSe (211) cell [see FIGS. 5a, 6a, and 6b with various layers forming RTS (16, 17, 150) and tunnel junction cells (18, 190)]. This cell can be further integrated with a ZnCdSe/ZnSSe quantum dot cell (#5). Layer 211 is deposited with p+-ZnSe (212) to form a low-voltage drop tunnel junction. Now one layer 215, hosting quantum dots 213 (selected from semiconductors selected from ZnSeTe, ZnCdSe) in a matrix (214) (semiconductor selected from ZnSe, ZnSSe, ZnMSSe), is formed. Similarly, another layer 217 hosting quantum dots 216 in a matrix 218, is formed on layer is deposited on a layer 219 which separates the two quantum dot consisting layers. Multiple layers of quantum dots are envisioned depending on the method of deposition. Layer 220 is the n+ZnSe cap layer on which top Ohmic contact grid 22 and AR coating 23 is formed. The layers hosting quantum dots would absorb sunlight beyond the energy gap of pZnSTe or ZnCdSe (in cell 4). Cell 5 is formed between p+ZnSe layer 212 and the n+ZnSe cap layer 220. These layers sandwich layers of quantum dots 215 and 217. It should be appreciated that the quantum dots can also be formed using selective area epitaxial growth in nanopatterned $SiO_2$ (as described in FIG. 12) using lateral epitaxial overgrowth techniques. One such technique has been used to grow nanowires [17].

Figure 14A:
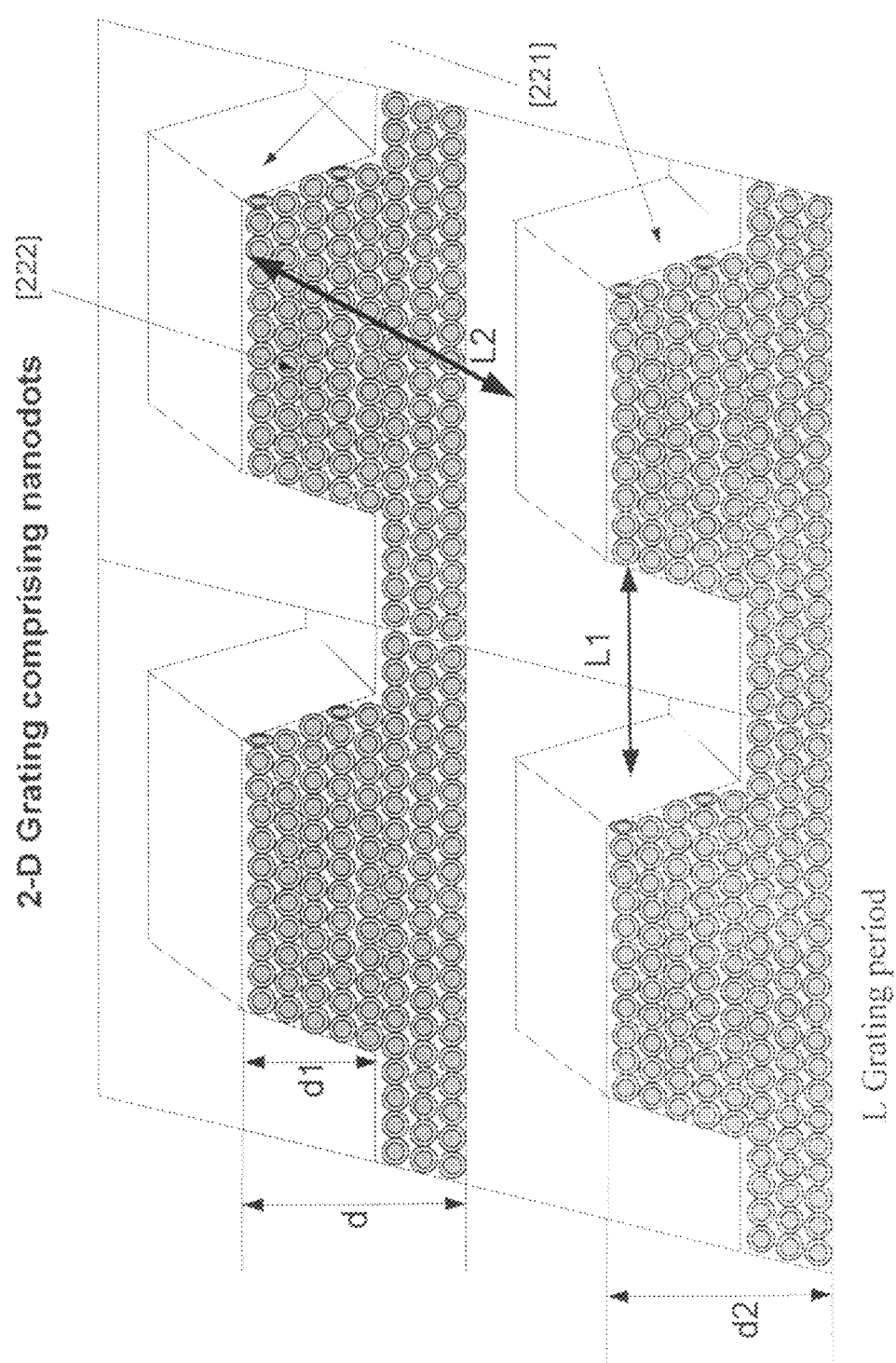
FIG. 14a is a diagram illustrating one embodiment of a patterned nanostructure grating serving as antireflection coatings for a broader spectral range using self-assembled cladded nanodots.
Figure 14B:
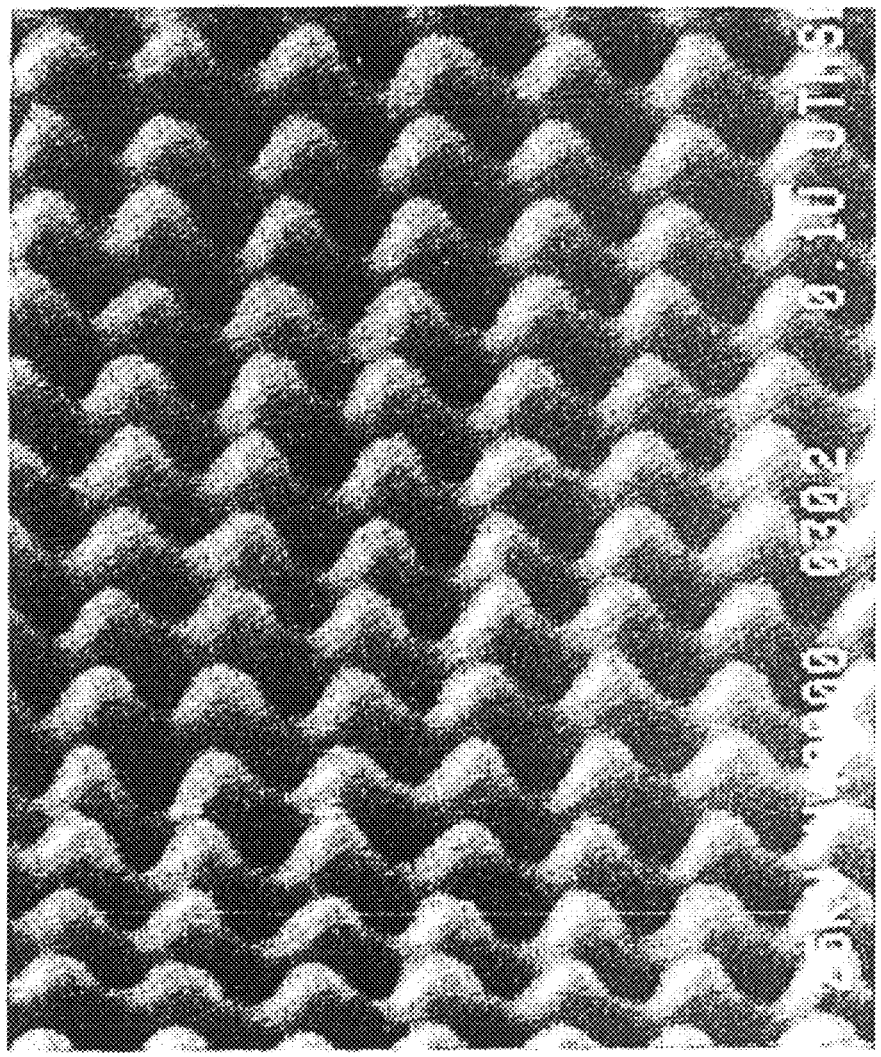
FIG. 14b shows a prior-art two dimensional grating.

Referring to FIG. 14a, it should be appreciated that patterned nanostructure grating may serve as antireflection coatings for broader spectral ranges. These patterned 2-D gratings are shown in FIG. 14a. A prior art 2-D grating is shown in FIG. 14b [15, 16]. It should be further appreciated that use of self-assembled $SiO_x$-cladded Si and $GeO_x$-cladded Ge dots can be used for the formation of two-dimensional gratings. Grating elements 221 consist of $SiO_x$-Si or $GeO_x$-Ge nanodots (222). One novelty in the use of cladded nanodots is their ability to adjust their effective dielectric constant. The effective dielectric constant of a $GeO_x$—Ge nanodot layer can be adjusted in the range of 8-14, depending on the cladding thickness and dot diameter. Various grating parameters such as grating periods (L1 and L2), grating ridge height d1, total grating thickness d2, will determine the antireflective properties as a function of the spectral wavelength regime. FIG. 14c shows a layered structure where uniform dielectric layers, with varying index of refraction, are deposited. For example, the assembly of $GeO_x$-cladded Ge nanodots serves as a high dielectric constant layer 224. This layer is deposited on top of the outermost semiconductor layer 223 in the solar cell structure. Note that the dielectric constant of layer 224 is less than layer 223. Another layer 225 (comprising of $SiO_x$-cladded Si nanodots) is deposited on top of layer 224. Note that the effective dielectric constant of $GeO_x$—Ge and $SiO_x$—Si dots depends on the core and cladding diameters. They can be changed between 10-12, and 6-8, respectively. The nanodot layer 225 is deposited by still lower dielectric constant SiON film 226 and subsequently by $SiO_2$ film 227. A combination of uniform index nanodot layers as well as pyramidal dots ($SiO_x$—Si dots) can also be used to obtain a broader spectral range grating.

In another embodiment, broad spectral range antireflection coating in configurations reported in the literature [25], cam be realized using cladded nanodots along with other layers.

Figure 15A:
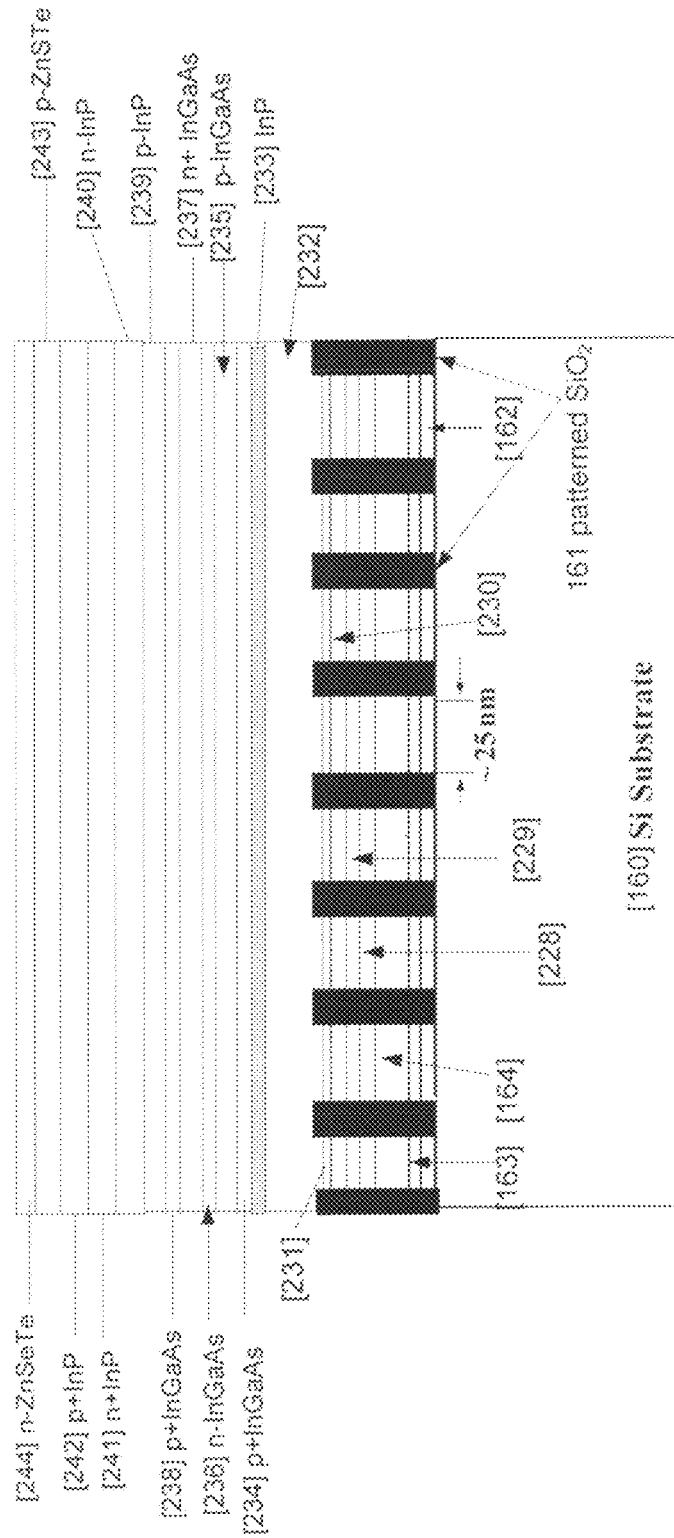
FIG. 15a shows the layers of InGaAs grown on Si substrate integrating dislocation reduction methodology as shown in FIG. 12.

FIG. 15a shows layers (229, 230) of InGaAs grown on Si substrate (160) integrating dislocation reduction methodology similar to that shown in FIG. 12 (where the growth of Ge base layer 166 and 167 is illustrated). The InGaAs-on-Si solar cell structures incorporates InGaAs cell, AlInAs—InP cell, and ZnSeTe cells. This is in contrast to cells illustrated in FIGS. 4-6. A typical process may incorporate the following steps: Similar to FIG. 12a, a $SiO_2$ layer is deposited and patterned (161) on a Si substrate (160) to obtain desired feature size (e.g., 22 nm or smaller to mitigate dislocations due to lattice mismatch). This followed by growth of thin buffer ZnS layer 162, a ZnMgS layer 163, and a graded ZnS to ZnSSe layer 164, and finally a ZnSe layer 228. Heat treatment of the grown II-VI layers (such as described for post heteroepitaxial patterning, PHP) may be used to glide dislocations from the II-VI transition layers into $SiO_2$ walls. A ZnSe-to-ZnSeTe graded layer 229 is deposited with a thin ZnSe buffer 230. A heat treatment to glide dislocation into SiO2 boundaries surrounding the II-VI layers is carried out. (In some cases, one heat treatment may suffice following ZnSeTe graded layer 229). An InGaAs layer 231 is grown on ZnSe layer 230 (or 229 ZnSeTe layer depending on the epitaxial process) between openings in the SiO2 layer 161. This is fol$_l$owed by lateral epitaxial overgrowth (LEO) 232. Depending on the LEO characteristics, the material for layer 232 can be selected from InGaAs, InP, AlInAs, or AlInAsP. InP layer 233 may be needed to planarize the LEO. The primary aim is to have dislocation density in layer 164 and 229/230 to be as small as possible.

Layers 232/233 is now used as a high quality base layer on which tandem cells are grown. The first cell#1 being InGaAs cell with thin p+ InGaAs contact layer 234, p–InGaAs absorber layer 235, and n–InGaAs layer 236 forming the n-p junction. The n+InGaAs layer 237 and p+InGaAs layer 238 forms the first tunnel junction. This is followed by p–InP absorber layer 239 and an n–InP layer 240 enabling the formation of n-p InP cell (#2). Layers 241 (n+InP) and 242 (p+InP) form the second tunnel junction. A layer of p–ZnSTe 243 and an n-type ZnSeTe (or ZnMgSTe) layer 244 is grown to obtain cell#3. The tandem 3-cell structure does not show top and bottom contacts and AR coating. The introduction of RTS interfaces is not shown explicitly. However, these RTS interfaces (comprising two barriers and a well) may be introduced between layers 242 (p+InP) and 243 (pZnSeTe) and 238 (p+InGaAs) and 239 (p–InP) to reduce voltage offsets.

Alternately, the structure of FIG. 15a can be implemented using site-specific self assembly methodology of FIG. 12b.

FIG. 15b shows InGaAs FETs, realized on Si substrate 160, using a p–InGaAs layer 245 [in turn grown on InP layer 233 (shown in detail in FIG. 15a)]. The p–InGaAs layer 245 has n-type source (246) and drain (247). The gate region is shown with lattice-matched insulator 248, on which two layers of GeOx-cladded-Ge dots (249) are assembled. The gate layer 250 and gate contact 251 are also shown. The source 252 and drain 253 contacts are formed using AuGeNi. Other materials may be used. The inset in FIG. 15b shows details of InGaAs FET which has quantum dot gate. These quantum dot gates can be used for memory and 3-state device operation. The part of Si where there is no patterning and InGaAs layers, a conventional Si FET 254 (scaled down to 30 nm) is integrated. This is an example of achieving integration of Si electronics with InGaAs—InP FET based very high frequency (above 500 GHz) devices, as well as solar cells. The solar cells are not shown in this figure explicitly.

Figure 16:
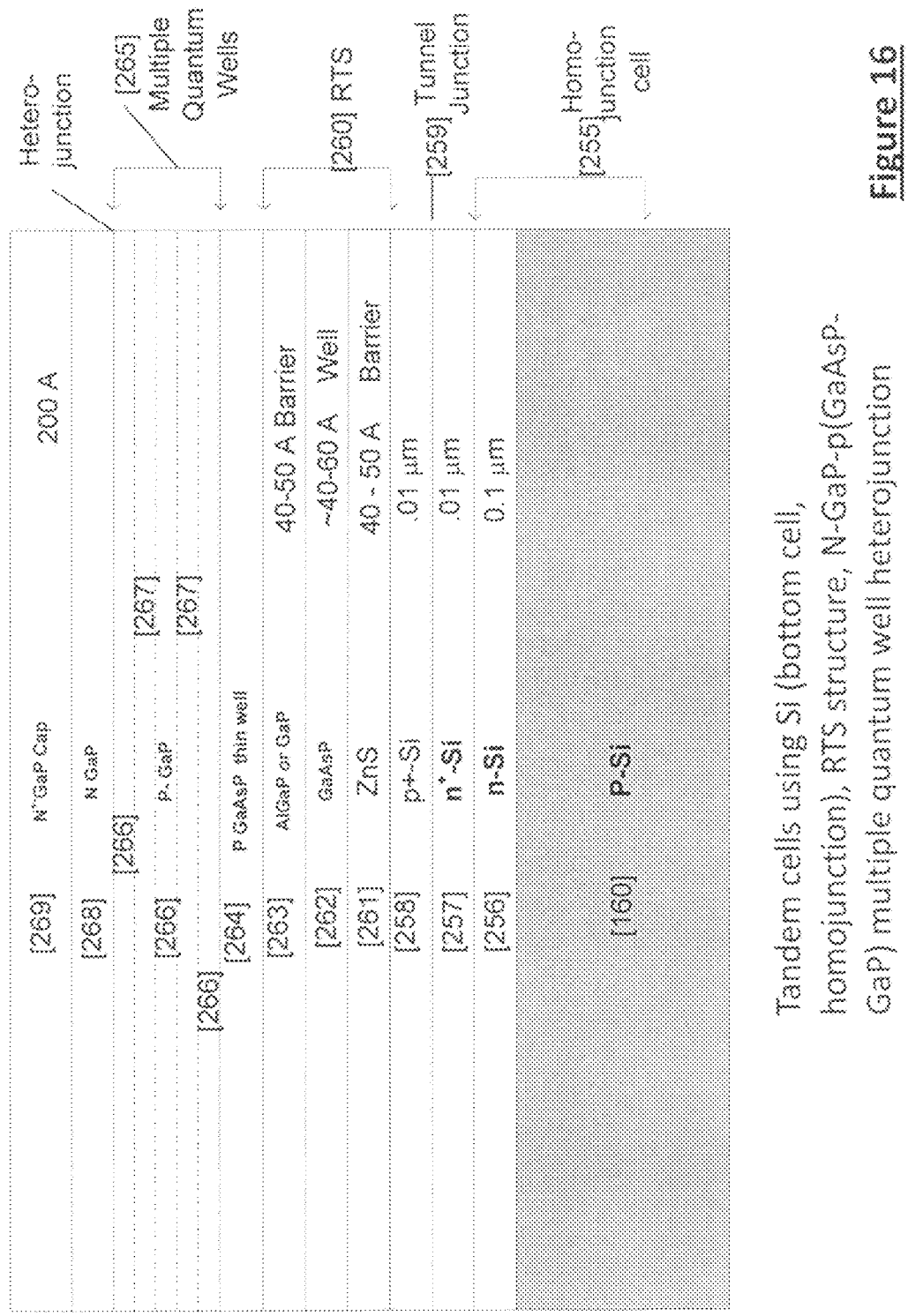
FIG. 16 Tandem cells using Si (bottom cell, homojunction), RTS structure, N—GaP-p(GaAsP—GaP) multiple quantum well heterojunction cell.

FIG. 16 illustrates tandem cells using p–Si substrate (like 160 in FIG. 12a or with different specifications) forming the bottom Si homojunction cell 255 (comprising of p–Si substrate 160, n-Si layer 256, and the homojunction between them), an n+ Si layer 257 and p+Si layer realizing the tunnel junction 259, and a RTS structure 260. The RTS in turn comprises 261 ZnS barrier layer, a GaAsP well 262, and another barrier layer 263 (which may be selected from GaP, AlGaP, AlGaAsP). The RTS facilitates current transport between Si cell and the GaAsP cell. Layer 263 is deposited with p–GaAsP thin layer (264). Layer 264 is deposited on with either a p–GaAsP layer (serving as the absorber of photons) or with p–GaP/p(GaAsP—GaP) multiple quantum wells (265). Here, the novelty is in the use of GaAsP—GaP multiple quantum wells (with barrier being GaP layer 266 and well being GaAsP 267). Since GaAsP does not lattice match with Si or GaP, we use a compressive strained quantum well (40-60 Angstroms) sandwiched between GaP barriers (50-80A). Many periods of MQWs are shown. The window region is n-layer 268 (n–GaP for heterojunction) or AlGaP with appropriate band gap and strain. The strain may be matched by use of tensile strained barrier. The total number of periods could be 50-70 which will create a region photons can be absorbed at wavelengths in a range of about 1.8-2.0 eV (depending on the composition). The Si homojunction cell will absorb radiation in the 1.1-1.8 eV spectral regime. The n+GaP can be used as a cap layer (269) to form top Ohmic contacts (not shown) or to form a n+/p+GaP tunnel junction (not shown). This can be followed by the formation of a II-VI cell (using ZnSSe and ZnMgS layers).

Figure 17A:
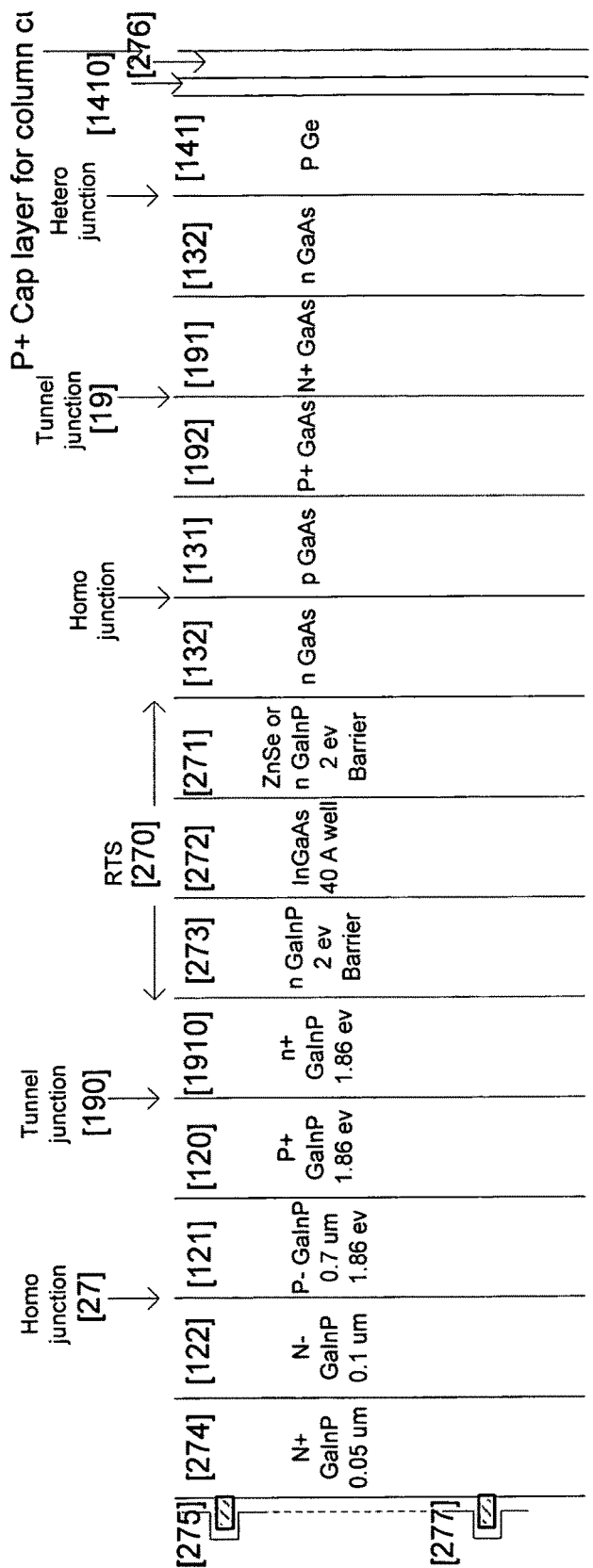
FIG. 17a shows homojunction and heterojunction cells integrated with RTS and tunnel junction interfaces.

FIG. 17a shows homojunction and heterojunction cells integrated with RTS and tunnel junction interfaces. Here, a Ge substrate 141 with p+Ge layer 1410 (to facilitate formation of back Ohmic contact 21) is used. The nGaAs layer 29 (FIG. 4c) forms the heterojunction 28 with pGe (141) and the combination works as a cell#1. Subsequently, layers 191 and 192 are incorporated to form a tunnel junction 19. Layer 132 (p–GaAs) serves as the absorber for the homojunction cell #2 (whose window region is n–GaAs layer 13; see FIG. 6a). Layer 132 of n–GaAs is contacted with a RTS interface 270, which is realized by barrier 271 (n–ZnSe, n–GaInP) and well layer 272 (InGaAs), and another barrier layer 273 (n–GaInP, band gap ~2 eV). This is followed by layer 1910 n+GaInP and layer 1920 p+GaInP together forming the tunnel junction # (190). Layer 1920 has layer 121 of p–GaInP which serves as the absorber of ~1.86 eV radiation. Together with layer 122, layer 121 forms a homojunction 27 and cell#3. Layer 274 provides a cap layer to form top Ohmic contact 275. Antireflection coating 276 is shown as well.

Figure 17B:
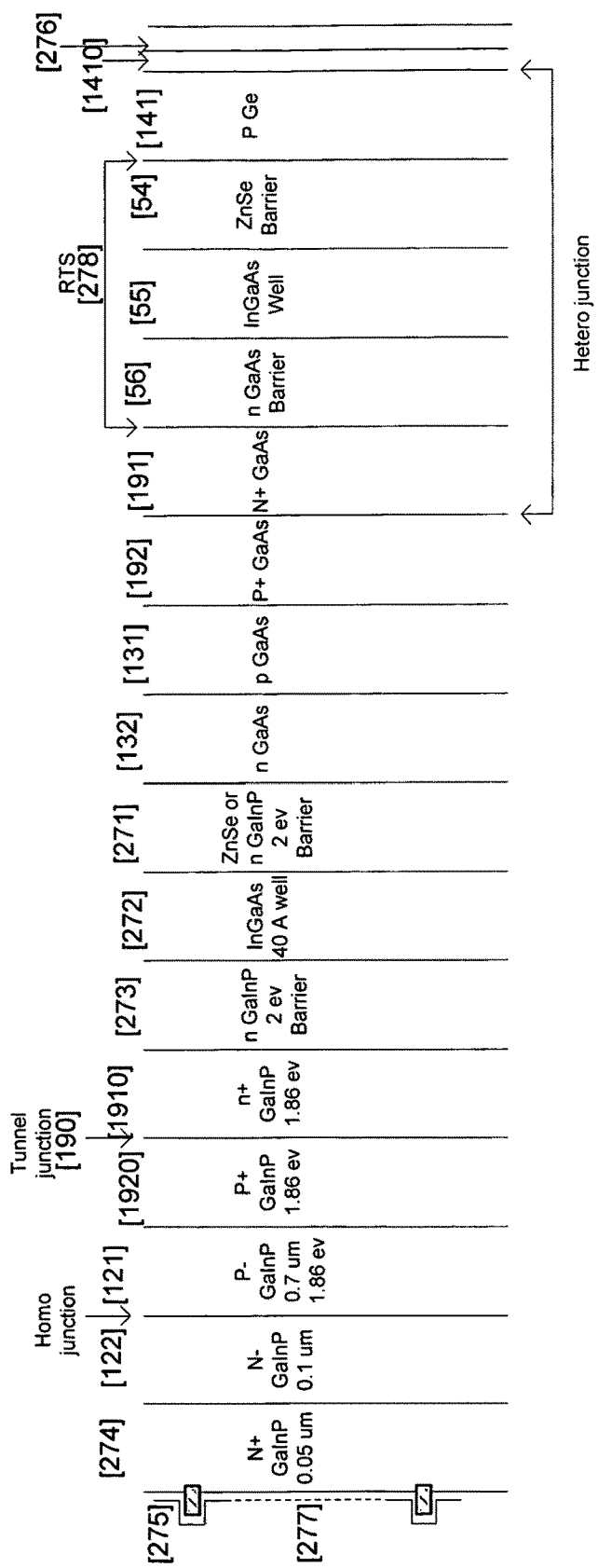
FIG. 17b shows a structure where a RTS is incorporated at the heterojunction (nGaAs-pGe).

FIG. 17b shows a structure where a RTS (277) is incorporated at the heterojunction (nGaAs-pGe) to facilitate charge transport. The RTS 277 comprises a barrier 54 (ZnSe), well 55 (InGaAs) and another barrier layer 56 (GaInP). Combination of RTS, heterojunctions, and homojunctions are envisioned to reduce the effect of band-offsets. In these structures, we can incorporate II-VI (ZnSe-based) cells to convert photons that are not effectively absorbed in GaInP (similar to shown in FIGS. 4-6).

Figure 18A:
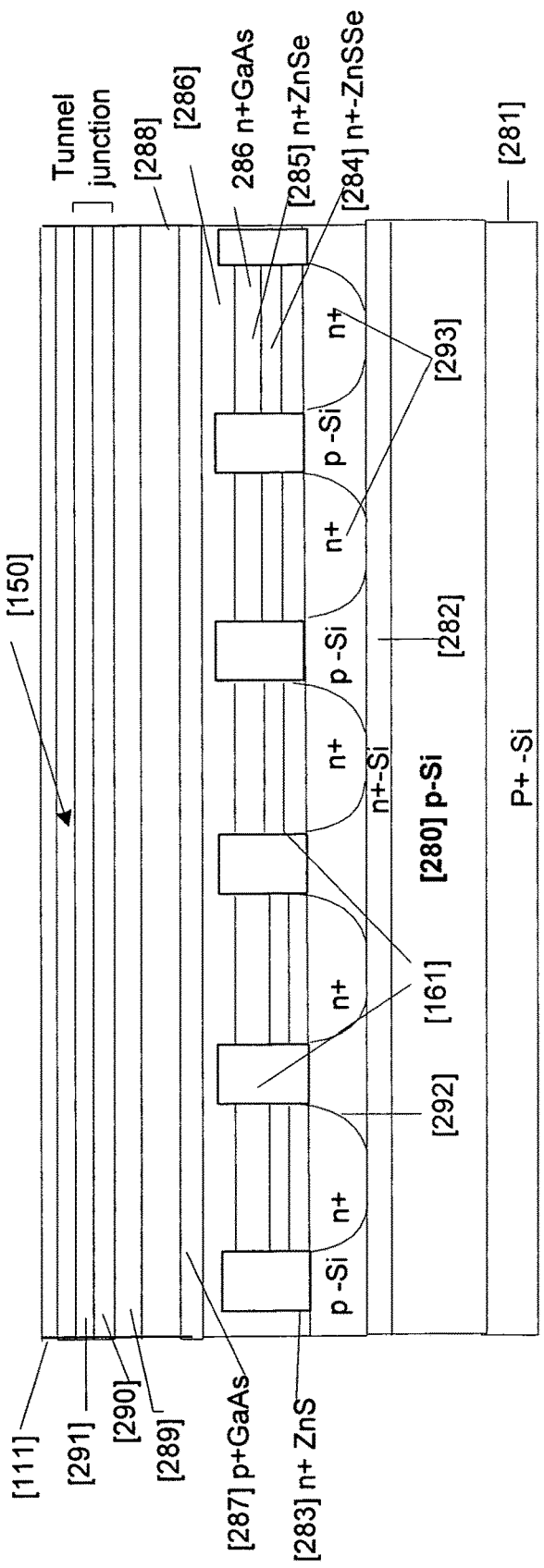
FIG. 18a shows a Si cell integrated with dislocation reduction structure providing interface for III-V and II-VI tandem cells.

FIG. 18a shows a Si cell [comprising of layers 281 (p+Si thin layer), 280 (p-Si photon absorbing layer) and 282 (n+-Si window region)], which is integrated with dislocation reduction structure providing interface for III-V and II-VI tandem cells. The dislocation reducing structure is similar to that of FIGS. 12a and 12b. Here, we use a nanopatterned SiO2 layer 161. The Si surface of layer 283, where there is no oxide, is deposited with n+ZnS or ZnMgS buffer layer 283 (unlike the layer 162 of FIG. 12a, here the layer 283 is shown doped). This is followed by a graded n+ZnSSe layer 284. Again this layer is n+ doped (see its counterpart 164 which is not shown doped). Upon this layer we have n+ZnSe (285). This deposition is followed by the heat treatment discussed before (in context to FIG. 12) to remove dislocations caused by lattice mismatch. This is followed by deposition of thin n+GaAs layer 286 which nearly fills the SiO2 surrounded regions and grows over SiO2 regions 161. Finally, layer 287 (p+GaAs) is grown over the lateral epitaxial overgrowth over the entire region forming a p+/n+ tunnel junction. This is followed by the growth of p–GaAs (or p–GaInP or p–AlGaAs with appropriate band gap) as the photon absorber layer 288. Layer 289 (selected from n–GaAs, n–GaInP or n–AlGaAs) is deposited to form either a hetero or homojunctions. The band gap of the absorber layer determines the spectral range of photons that are absorbed by the Si cell underneath. Layer 289 has on top of it a thin n+ AlGaAs or n+GaInP (layer 290) and a thin p+AlGaAs or p+GaInP (291) layer. The two layers form the tunnel junction. Additionally (like FIG. 6a), a II-VI cell of ZnSTe (layers 111, 1120) can be fabricated. Here, RTS structure 150 may be disposed between layer 291 and layer 111. This figure also shows p–Si layer 292 which is doped n+ (293) in regions where SiO2 layer 161 has openings. Layer of ZnS (283) is grown on n+Si regions 293.

Figure 18B:
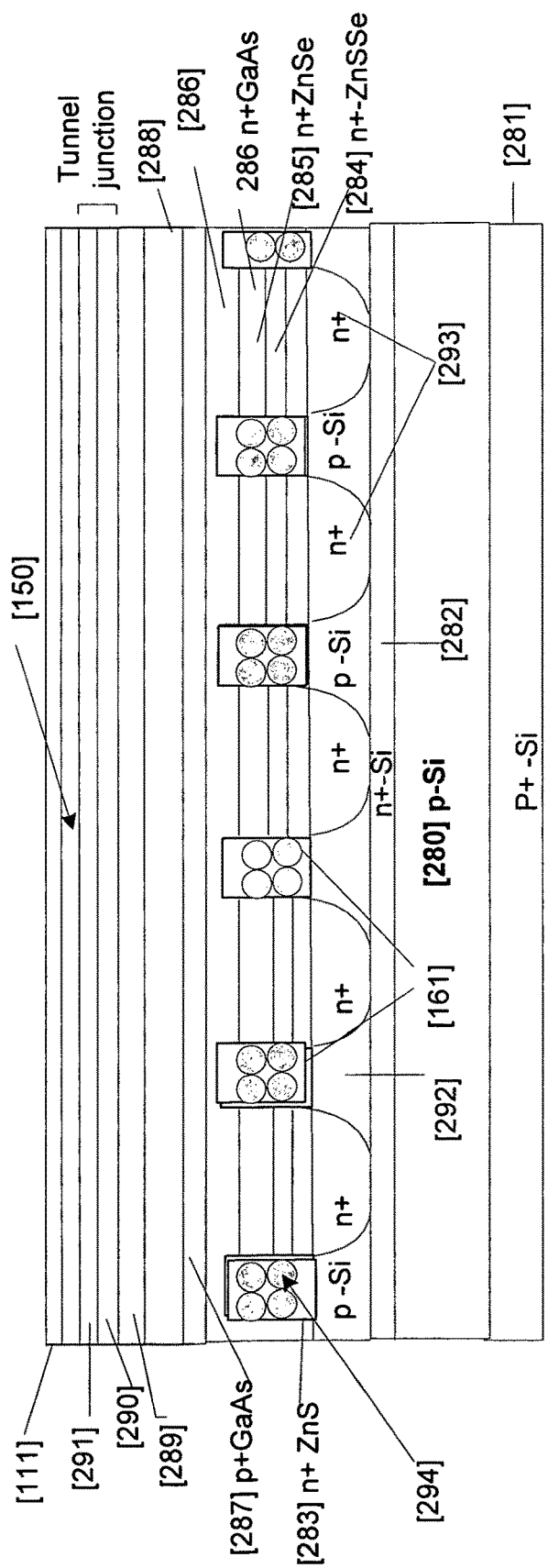
FIG. 18b shows a Si cell integrated with dislocation reduction methodology integrating structure consisting of SiOx-Si cladded dots providing interface for III-V and II-VI tandem cells.

FIG. 18b shows a Si cell integrated with dislocation reduction methodology integrating structure consisting of SiOx-Si cladded dots providing interface for III-V and II-VI tandem cells. SiOx-cladded Si dots (294) are self-assembled on the surface of p–Si regions (295) in the layer 292 (where n+ doping is not there).

It should be appreciated that simulation of tandem solar Cells may be needed to successfully fabricate Ge, Group III-V, and Group II-VI structures. Additionally, tandem laser structures which incorporate tunnel junctions have been reported [18, 19] and they can form guides to the design of high concentration solar cell designs. It is contemplated that cell modeling can be accomplished using known design equations.

Additionally, fabrication of Group II-VI heterojunction cells may be accomplished, where Group II-VI layers have been in various combinations on GaAs, InGaAs—InP, Ge and Si substrates [21,22]. ZnSe—GaAs cells [23,24] and n-ZnMgS-pSi and ZnSSe—Si solar cells may be fabricated [24]. It should be appreciated that lattice matched wide-energy gap Group II-VI layers (such as ZnMgS-on-Si or ZnSSe-on-GaInP) serves at least two functions: (1) wide energy gap window region to ensure low-leakage current and (2) antireflection coating when its thickness is appropriately chosen particularly for the peak wavelength spectral regime. The zinc sulfoselenide and ZnMgS material systems offer a wide range of direct bandgaps for the fabrication of Si-based tandem solar cells.

Furthermore, growth of ZnSe—ZnSSe cladding on Ge dots may be accomplished, where $GeO_x$ cladding from Ge dots may be removed and replaced by n–ZnSe layer that may be grown using metalorganic chemical vapor phase deposition (MOCVD) (or some other suitable method). This provides needed cladding to separate Ge dots to realize a high absorption coefficient α of ~100,000 $cm^{-1}$. A second set of larger diameter (lower effective band gap Eg2) Ge dots may be self-assembled with a ZnSe cladding layer. Also, fabrication of Quantum Dot Solar Cells may be accomplished where a single junction solar cell can be fabricated by depositing a thin GaAs or GaInP layer over ZnSe layer hosting Ge quantum dots (Eg3). Processing steps for Ohmic contacts may be any processing step suitable to the desired end purpose, such as similar to those known for ZnSe—GaAs cells.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. It should be appreciated that although the invention is described herein with regards to certain materials and/or combination of materials, this is not meant to be limiting and as such, other materials and/or combination of materials having properties and/or characteristics suitable to the desired end purpose may also be used. Moreover, it should be further appreciated that although the method of the invention is described herein with regards to certain processes and/or combination of processes, this is not meant to be limiting and as such, other processes and/or combination of processes suitable to the desired end purpose may also be used. Moreover, unless specifically stated any use of the terms first, second, etc. do not denote any order or importance, but rather the terms first, second, etc. are used to distinguish one element from another.

CITED REFERENCES

[1] R. A. Metzger, Manufacturing of III-V solar cells for space applications, p. 25, Compound Semiconductors, November/December 1996.
[2] Bett. et al., Proc. WCPEC-4, p. 729, 2006 (Waikoloa, Hi.).
[3] F. Dimroth, Phys. Status Solidi, 3, (3), p. 373 (2006).
[4] F. Dimroth and S. Kurtz, High Efficiency Multijunction Solar Cells, Material Res. Bull., 32, p. 230, March 2007.
[5] R. King et al., $20^{th}$ Proc. Ear. Photovoltaic Solar Energy Conf., p. 118, 2005 (Barcelona, Spain).
[6]. X. G. Zhang, A. Rodriguez, X. Wang, P. Li, F. C. Jain, and J. E. Ayers, "Complete Removal of Threading Dislocations by Patterned Heteroepitaxial Processing", Appl. Phys. Lett. Vol. 77, pp. 2524-2526, October 2000.
[7]. X. G. Zhang, A. Rodriguez, P. Li, F. C. Jain, and J. E. Ayers, JAP, Vol. 91, pp. 3912-3917, Mar. 15, 2002.
[8] T. S. Zheleva et al., Appl. Phys. Lett., Vol. 74, pp. 2492, 1999.
[9] F. Jain, M. Gokhale, R. LaComb, and C. Chung, "Resonant Tunneling structures to Obtain Improved Electrical Contacts in ZnSe-on GaAs Blue-green Laser", Proc. 1993 Int. Semiconductor Device Research Conf. pp. 591-594, Dec. 1-3, 1993 (Charlottesville, Va.).
[10] Y. Fan et al, Graded bandgap Ohmic contact to p-ZnSe, Appl. phys. Lett., 61, pp. 3160-3162, December 1992.
[11]. A. Alguno et al., Enhanced quantum efficiency of solar cells with self-assembled Ge dots stacked in multilayer structure, appl. Phys. Lett., 83, pp. 1258-160, August 2003.
[12] R. B. Laghumavarapu, Improved device performance of InAs/GaAs quantum dot solar cells with GaP strain compensation layer, Appl. Phys. Lett., 91, pp. 243115-243118 (2007).
[13] A. Luque, A. Marti, N. Lopez, E. Antolin, and E. Canovas, J. Appl. Phys., 99, p. 094503, 2006.
[14] R. B. Laghumavaru, M. El-Emway, N. Nuntawong, A. Moscho, L. F. Lester, and D. L. Huffaker, Improved device performance of InAs/GaAs quantum dot solar cells with GaP strain compensation layers, Appl. Phys. Lett., 91, pp. 243115-243118 (2007).
[15]. I. Richter et al., Design considerations of form Birefringent microstructures, Applied Optics, 34, pp. 2421-2429, May 1995.
[16] S. T. Han et al., Electromagnetic scattering of two-dimensional surface-relief dielectric gratings, Applied Optics, 31, pp. 2343-2352, (1992).
[17] F. Jain and F. Papadimitrakopoulos, Site-specific self assembly of nanoparticles, U.S. Pat. No. 7,368,370 B2, May 6, 2008.
[18] F. Jain and C. Chung, "Multiple Output Quantum Well Laser Structures Incorporating Cascaded Tunnel Junctions," Proc. Int. Electron Devices and Materials Symp., pp. 135-138, Nov. 1-4, 1992 (Taipei, Taiwan).
[19] F. Jain, S. Srinivasan, E. Heller, R. LaComb, M. Gokhale, and W. Huang, Monolithic Integration of Red, Blue, and Green Lasers for Smart Projection Displays, J. Soc. Information Displays, Vol. 5, No. 3, pp. 241-250, November 1997.
[20] S. R. Kurtz, P. Faine, and J. M. Olson, J. Appl. Phys. 68, p. 1890, (1990).
[21] B. Yarlagadda, A. Rodriguez, P. Li, B. I. Miller, F. C. Jain and J. E. Ayers, "Elastic Strains in Heteroepitaxial $ZnSe_{1-x}Te_x$ on InGaAs/InP (001)", J. of Electronic Materials, 36, 6, June 2006.
[22] B. Yarlagadda, A. Rodriguez, P. Li, R. Velampati, J. F. Ocampo, E. N. Suarez, P. B. Rago, D. Shah, J. E. Ayers, and F. C. Jain, X-ray characterization of dislocation density asymmetries in heteroepitaxial semiconductors, Appl. Phys Lett. 92 (21), May 2008.
[23] D. W. Parent, A. Rodriguez, J. E. Ayers, and F. C. Jain, Photoassisted MOVPE Grown (n) $ZnSe/(p^+)GaAS$ heterojunction solar cells, Solid-State Electronics, 47, pp. 595-599, 2003.
[24] E. Suarez, J. Ayers, and F. Jain, Heterojunction n-Zn-MgS-pSi Solar cells, Proceedings of the $17^{th}$ Connecticut Microelectronics and Optoelectronics Symposium, Apr. 9, 2008.
[25] D. J. Poxson, Frank W. Mont, Jong Kyu Kim, and E. Fred Schubert, Multilayer nano-structured anti-reflection coatings with broad-band omni-directional characteristics, Proceedings of $17^{th}$ CMOC symposium, pp. 29-30, Apr. 9, 2008 (University of Connecticut, Storrs, Conn. 06269).

I claim:

1. A solar cell structure, comprising:
   a plurality of solar cells, wherein the plurality of solar cells include a first cell, a second cell, a third cell and a fourth cell,
   wherein each of the solar cells is at least partially constructed from a semiconductor material having an energy band gap that harnesses photons having energies in a predetermined energy range which is responsive to the energy band gap, and
   wherein each of the solar cells includes at least one of a p-n junction, an n-p junction, and a Schottky interface,
   wherein each of the solar cells is configured to harness energies in a solar spectral energy range that differs from the other of the solar cells, and
   wherein adjacent cells include at least one of a homojunction and a heterojunction, wherein the heterojunction has an n-region and a p-region which serves as an absorber layer, the n-region having a higher energy gap than the p-region, and
   wherein the solar cell structure includes a first resonant tunneling structure and a second resonant tunneling structure, wherein a first tunnel junction and the first resonant tunneling structure is located between a first cell and a second cell, wherein the first tunnel junction is constructed from doped n+ and p+ Ge layers, and the first resonant tunneling structure being located between the first tunnel junction and an absorber p-type GaAs layer of the second cell, the first resonant tunneling structure including a first quantum barrier layer, a second quantum well layer, and a third quantum barrier layer, wherein the first quantum barrier layer is constructed from at least one of ZnSe, GaInP, or AlGaAs, the second quantum well layer is constructed from at least one of GaAs, or InGaAs, and the third quantum barrier layer is constructed from at least one of GaInP, ZnSe, or AlGaInP, and wherein a second resonant tunneling structure and a second tunnel junction is located between the second cell and the third cell, wherein the second tunnel junction includes at least one of a n+-p+ GaInP tunnel junction and a n+-p+ GaAs tunnel junction, and wherein the second resonant tunneling structure includes a fourth quantum barrier layer, a fifth quantum well layer, and a sixth quantum barrier layer, wherein the fourth quantum barrier layer is constructed from at least one of ZnSe, AlGaInP, AlAs, and ZnSTe, the fifth quantum well layer is constructed from at least one of GaAs, GaInP, and AlGaAs, and the sixth quantum barrier layer is constructed from at least one of AlGaInP, ZnSe, and ZnSTe, and wherein a third tunnel junction and a third resonant tunneling structure is located between the third cell and the fourth cell, wherein the third resonant tunneling structure includes a seventh quantum barrier layer, a eighth quantum well layer, and a ninth quantum barrier layer, wherein the seventh quantum barrier layer is constructed from at least one of ZnSTe, ZnCdSe, AlGaInP and ZnSe, and wherein the eighth quantum well layer is constructed from at least one of ZnSTe, ZnCdSe, or AlGaInP, and wherein the ninth quantum barrier layer is constructed from at least one of ZnSe or ZnMgSTe, and wherein the first cell has a bottom Ohmic contact on a p–Ge layer, and the fourth cell has a contact grid on a top n-layer, wherein the n-layer of the fourth cell has a doped n+ layer constructed from at least one of ZnSe, and ZnSSe to facilitate top Ohmic contact and the top Ohmic contact is electrically connected to the contact grid, wherein the top n-layer of the fourth cell is deposited with a dielectric coating which at least partially serves as an antireflection coating.

2. The solar cell structure of claim 1, wherein when at least one of the solar cells includes a n-p junction, the n-p junction includes a p-type absorber layer and an n-type window layer, wherein the absorber layer is thicker than the window layer in an n-p junction which is of the homojunction type constructed from one semiconductor material, wherein the solar cell structure includes, a first cell constructed of an n-p junction realized in Ge, wherein the first cell is operating in an energy range of between about 0.67 to about 1.42 eV, a second cell constructed of an n-p junction realized in a semiconductor material selected from one of GaInAs and GaAs, wherein the second cell is operating in an energy range of between about 1.42 to about 1.86 eV, a third cell constructed of an n-p junction realized in GaInP, wherein the third cell is operating in an energy range of between about 1.86 to about 2.4 eV, and a fourth cell constructed of an n-p junction realized using a semiconductor material selected from one of ZnCdSe, ZnSe, ZnSSe, ZnMgSSe and ZnMgSTe, wherein the fourth cell is operating in an energy range of between about 2.4 to about 3.7 eV.

3. The solar cell structure of claim 2, further comprising a tunnel junction cell, wherein the tunnel junction cell includes a first doped semiconducting material layer deposited on a top layer of the solar cell structure and a second doped semiconducting material layer deposited on the first doped semiconducting material layer, wherein the first and second doped semiconducting material layers have opposite conductivity to each other, wherein the first doped semiconducting material layer is of the same conductivity type as the top layer of the solar cell structure, and wherein the second doped semiconducting material layer is of the conductivity as that of a bottom layer of the solar cell structure.

4. The solar cell structure of claim 1, wherein at least one of the at least one n-p junction is constructed of an n-p homojunction and wherein at least one of the at least one n-p junction is constructed of an n-p heterojunction, wherein the at least one n-p heterojunction has a first energy gap absorber layer and a first energy gap window region, and wherein the at least one n-p homoojunction has a second energy gap absorber layer and a second energy gap window region, and wherein the n-p homojunction and the n-p heterojunction have at least one of a tunnel junction or a resonant tunneling structure located between the first and second energy gap window regions and the first and second energy gap absorber layers, and wherein the n-p heterojunction is selected from at least one of a single heterojunction and a double heterojunction.

5. The solar cell structure of claim 1, wherein the energy gap absorber layer of the n-p junction includes a multiple quantum well structure having a set of alternating quantum well and quantum barrier layers.

6. The solar cell structure of claim 1, wherein the n-p junction is at least partially constructed from at least one of GaInP, GaInAs, Ge, GaInNAs, AlGaInP, AlGaAs, Si, ZnSTe, ZnSe, ZnSSe, ZnSeTe, CdTe, CdS, and any combination thereof.

7. The solar cell structure of claim 1, wherein at least one of first, second and third tunnel junctions are constructed from a doped semiconductor material doped in the range of about $10^{18}$ to about $10^{20}$ cm$^{-3}$, wherein the doped semiconductor material is at least partially constructed from at least one of Si, GaAs, GaInP, InGaAs, InP, ZnSTe, ZnSeTe, and Ge.

* * * * *